(12) United States Patent
Lee

(10) Patent No.: US 11,004,825 B2
(45) Date of Patent: May 11, 2021

(54) SEMICONDUCTOR PACKAGE OF PACKAGE-ON-PACKAGE TYPE

(71) Applicant: SAMSUNG ELECTRONICS CO., LTD., Suwon-si (KR)

(72) Inventor: Dong-ha Lee, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 25 days.

(21) Appl. No.: 16/023,755

(22) Filed: Jun. 29, 2018

(65) Prior Publication Data

US 2019/0164938 A1 May 30, 2019

(30) Foreign Application Priority Data

Nov. 29, 2017 (KR) .................. 10-2017-0161843

(51) Int. Cl.
*H01L 25/065* (2006.01)
*H01L 23/552* (2006.01)
(Continued)

(52) U.S. Cl.
CPC ........ *H01L 25/0657* (2013.01); *H01L 23/552* (2013.01); *H01L 24/09* (2013.01); *H01L 25/105* (2013.01); *H01L 24/19* (2013.01); *H01L 25/0655* (2013.01); *H01L 2224/12105* (2013.01); *H01L 2224/131* (2013.01); *H01L 2224/16227* (2013.01); *H01L 2224/48227* (2013.01); *H01L 2225/1023* (2013.01); *H01L 2225/1035* (2013.01); *H01L 2225/1041* (2013.01); *H01L 2225/1058* (2013.01); *H01L 2225/1088* (2013.01); *H01L 2924/15159* (2013.01);
(Continued)

(58) Field of Classification Search
CPC .............. H01L 25/0657; H01L 25/105; H01L 2924/3025
See application file for complete search history.

(56) References Cited

U.S. PATENT DOCUMENTS 6,297,551 B1 * 10/2001 Dudderar .............. H01L 23/055
257/686
8,169,064 B2    5/2012 Kim
(Continued)

FOREIGN PATENT DOCUMENTS

JP        2000322990 A  * 11/2000   ...... B29L 2031/3493

*Primary Examiner* — Thao X Le
*Assistant Examiner* — Gardner W. S. Swan
(74) *Attorney, Agent, or Firm* — Sughrue Mion, PLLC

(57) ABSTRACT

Provided is a semiconductor package of a package on package (PoP) type having an improved electromagnetic wave shielding property. The semiconductor package includes: a first sub-package including a first package base substrate on which a first semiconductor chip is mounted, and an electromagnetic wave shielding member having a top portion and side portions respectively at a top surface and side surfaces of the first sub-package, wherein a groove space extends inward from a bottom surface of the first sub-package; and a second sub-package including a second package base substrate in the groove space and on which a second semiconductor chip is mounted, wherein the second sub-package is connected to the first sub-package through an inter-package connection terminal attached to a first package connection pad at a bottom surface of the groove space of the first sub-package.

16 Claims, 17 Drawing Sheets

(51) Int. Cl.
   *H01L 23/00*  (2006.01)
   *H01L 25/10*  (2006.01)
(52) U.S. Cl.
   CPC .............. *H01L 2924/15311* (2013.01); *H01L 2924/3025* (2013.01)

(56) References Cited

U.S. PATENT DOCUMENTS

| | | | |
|---|---|---|---|
| 8,250,403 B2 | 8/2012 | Lee | |
| 8,285,946 B2 | 10/2012 | Eleftheriou et al. | |
| 8,338,941 B2 | 12/2012 | Lee et al. | |
| 8,631,202 B2 | 1/2014 | Kim | |
| 8,719,532 B2 | 5/2014 | Jo et al. | |
| 9,484,327 B2 | 11/2016 | Kim et al. | |
| 9,520,387 B2 | 12/2016 | Kim et al. | |
| 2005/0104196 A1* | 5/2005 | Kashiwazaki | H01L 25/0657 257/706 |
| 2005/0151599 A1* | 7/2005 | Ido | H03H 9/72 333/133 |
| 2007/0252256 A1 | 11/2007 | Lim et al. | |
| 2009/0063895 A1 | 3/2009 | Smith | |
| 2009/0302435 A1* | 12/2009 | Pagaila | H01L 21/561 257/659 |
| 2010/0250826 A1 | 9/2010 | Jeddeloh | |
| 2011/0018121 A1* | 1/2011 | Lee | H01L 21/76898 257/692 |
| 2011/0087824 A1 | 4/2011 | Lin et al. | |
| 2011/0304015 A1* | 12/2011 | Kim | H01L 23/552 257/532 |
| 2012/0228751 A1* | 9/2012 | Song | H01L 23/552 257/660 |
| 2012/0267782 A1 | 10/2012 | Chen | |
| 2013/0013848 A1 | 1/2013 | Cho | |
| 2013/0052776 A1 | 2/2013 | Nalla et al. | |
| 2013/0159608 A1 | 6/2013 | Shin et al. | |
| 2013/0200524 A1 | 8/2013 | Han et al. | |
| 2013/0262920 A1 | 10/2013 | Jung et al. | |
| 2014/0215290 A1 | 7/2014 | Frost et al. | |
| 2014/0325148 A1 | 10/2014 | Choi et al. | |
| 2015/0037937 A1 | 2/2015 | Park et al. | |
| 2016/0035679 A1* | 2/2016 | Chen | H01L 21/52 361/736 |
| 2016/0371012 A1 | 12/2016 | Song et al. | |
| 2018/0358302 A1* | 12/2018 | Tuominen | H01L 23/3107 |

* cited by examiner

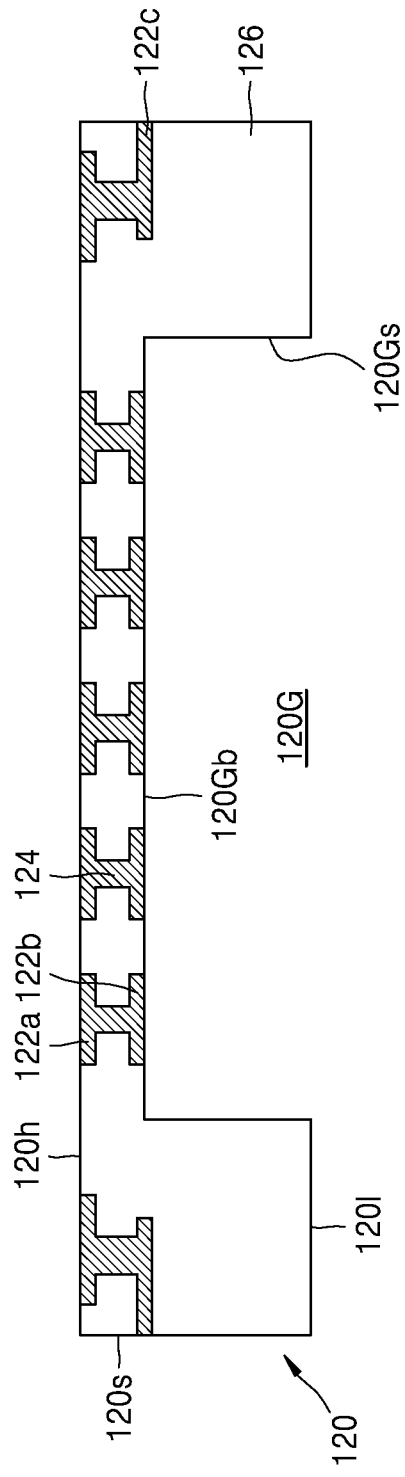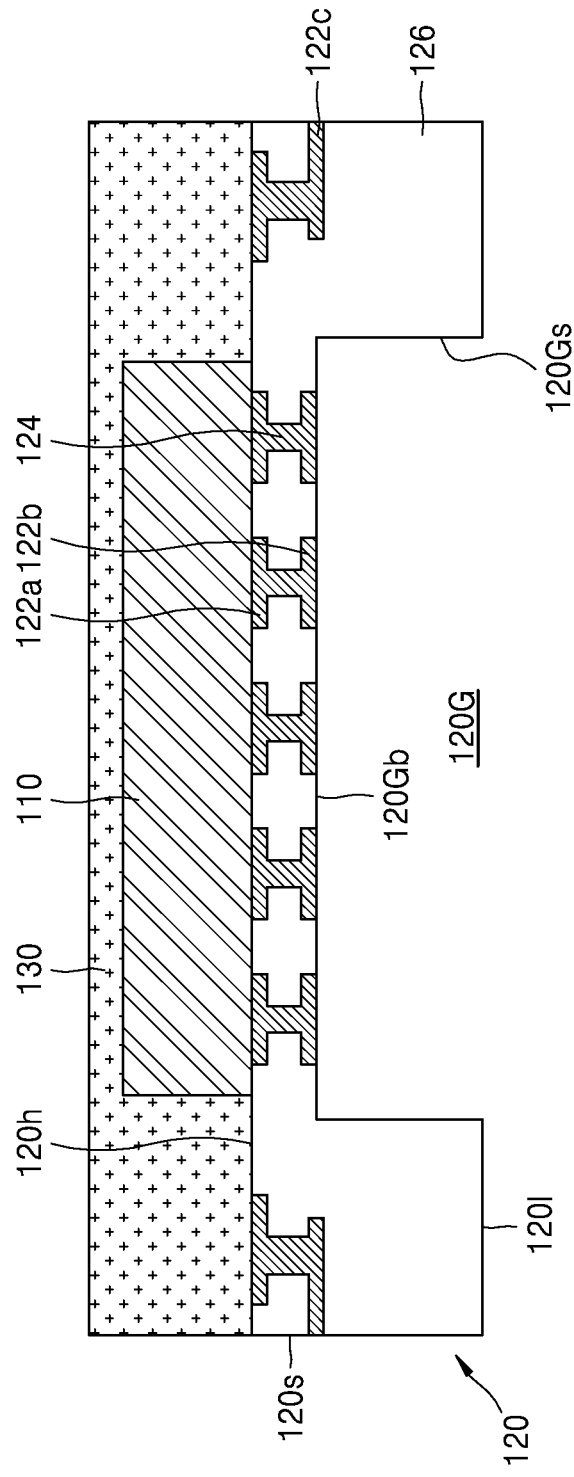

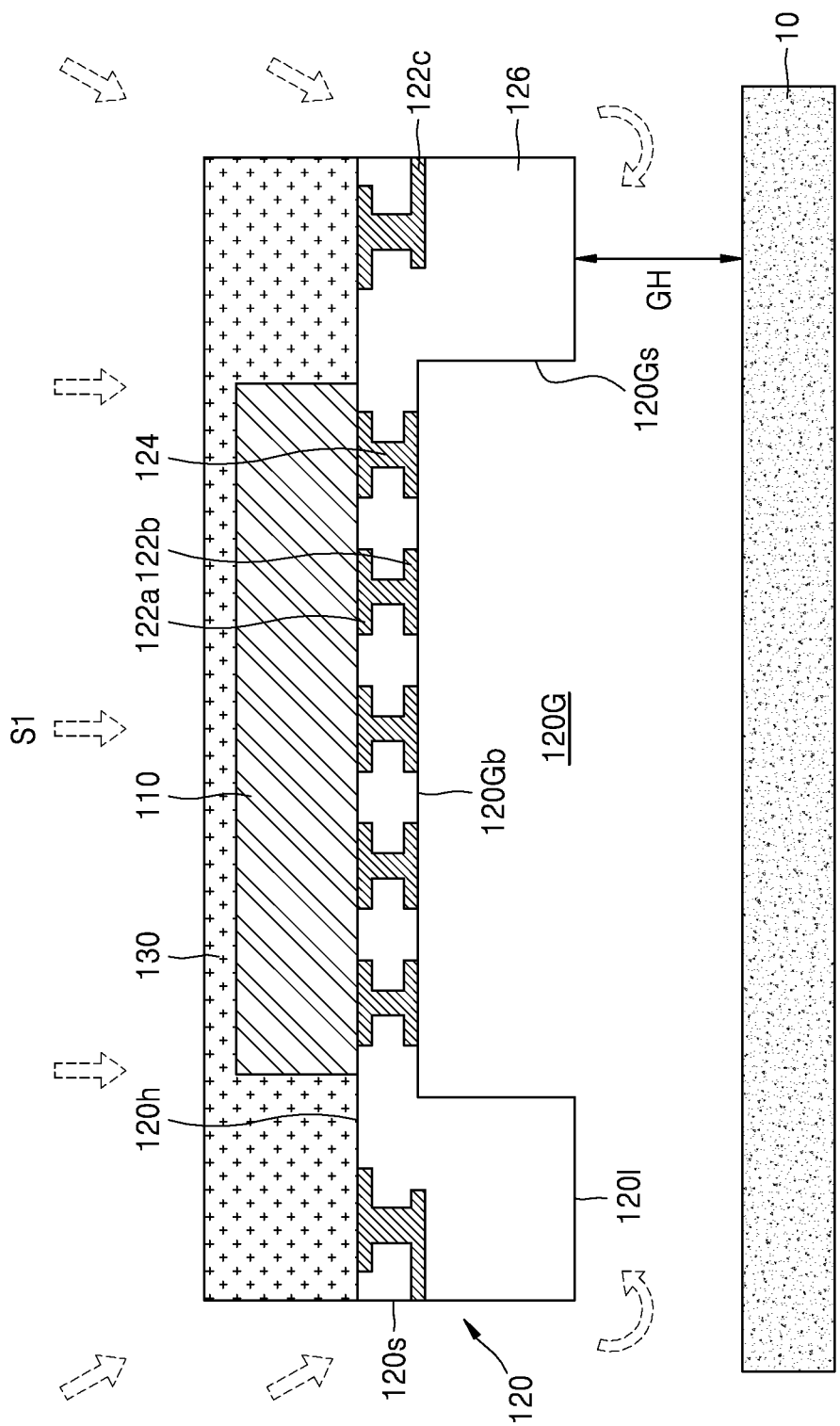

SEMICONDUCTOR PACKAGE OF PACKAGE-ON-PACKAGE TYPE

CROSS-REFERENCE TO RELATED APPLICATION

This application claims priority from Korean Patent Application No. 10-2017-0161843, filed on Nov. 29, 2017 in the Korean Intellectual Property Office, the disclosure of which is incorporated herein in its entirety by reference.

BACKGROUND

Apparatuses and methods consistent with one or more exemplary embodiments relate to a semiconductor package of a package-on-package (PoP) type, in which a sub-package is stacked on another sub-package.

Electronic devices are becoming more compact and light in response to user demand and rapid technological developments in the electronics industries. In this regard, high integration of semiconductor devices, which are core parts of the electronic devices, is required. Also, as mobile products are developed, miniaturization and multi-functionalization are also required.

Accordingly, in order to provide a multi-functional semiconductor package, a semiconductor package of a PoP type, in which a sub-package having a different function is stacked on another sub-package, is being developed.

SUMMARY

Aspects of one or more exemplary embodiments provide a semiconductor package of a package-on-package (PoP) type, which has an improved electromagnetic wave shielding property.

According to an aspect of an exemplary embodiment, there is provided a semiconductor package including: a first sub-package including: a first package base substrate on which a first semiconductor chip is mounted, and an electromagnetic wave shielding member having a top portion at a top surface of the first sub-package, and side portions at side surfaces of the first sub-package, wherein a groove space extends inward from a bottom surface of the first sub-package; and a second sub-package including a second package base substrate in the groove space and on which a second semiconductor chip is mounted, wherein the second sub-package is connected to the first sub-package through an inter-package connection terminal attached to a first package connection pad on a bottom surface of the groove space of the first sub-package.

According to an aspect of another exemplary embodiment, there is provided a semiconductor package including: a first sub-package including: a first package base substrate, a first semiconductor chip on the first package base substrate, a first molding member on the first package base substrate and surrounding the first semiconductor chip, and an electromagnetic wave shielding member covering a top surface of the first molding member, side surfaces of the first molding member, and side surfaces of the first package base substrate, wherein the first sub-package has a groove space extending inward from a bottom surface of the first package base substrate; and a second sub-package provided in the groove space and including: a second package base substrate, a second semiconductor chip on the second package base substrate, and a second molding member on the second package base substrate and surrounding the second semiconductor chip, wherein a bottom surface of the first sub-package and a bottom surface of the second sub-package are at a same height.

According to an aspect of another exemplary embodiment, there is provided a semiconductor package including: a first sub-package including: a first package base substrate on which a first semiconductor chip is mounted, an upper molding member on a top surface of the first package base substrate and surrounding the first semiconductor chip, and an electromagnetic wave shielding member covering a top surface of the upper molding member, side surfaces of the upper molding member, and side surfaces of the first package base substrate; and a second sub-package including a second package base substrate on which a second semiconductor chip is mounted, wherein the first sub-package has a groove space extending inward from a bottom surface of the first sub-package, and wherein side surfaces of the second sub-package and inner side surfaces of the groove space are spaced apart from each other in the groove space.

BRIEF DESCRIPTION OF THE DRAWINGS

Exemplary embodiments will be more clearly understood from the following detailed description taken in conjunction with the accompanying drawings in which:

FIGS. 9 through 12 are cross-sectional views sequentially illustrating processes of manufacturing a semiconductor package, according to an exemplary embodiment;

DETAILED DESCRIPTION OF EXEMPLARY EMBODIMENTS

Figure 1:
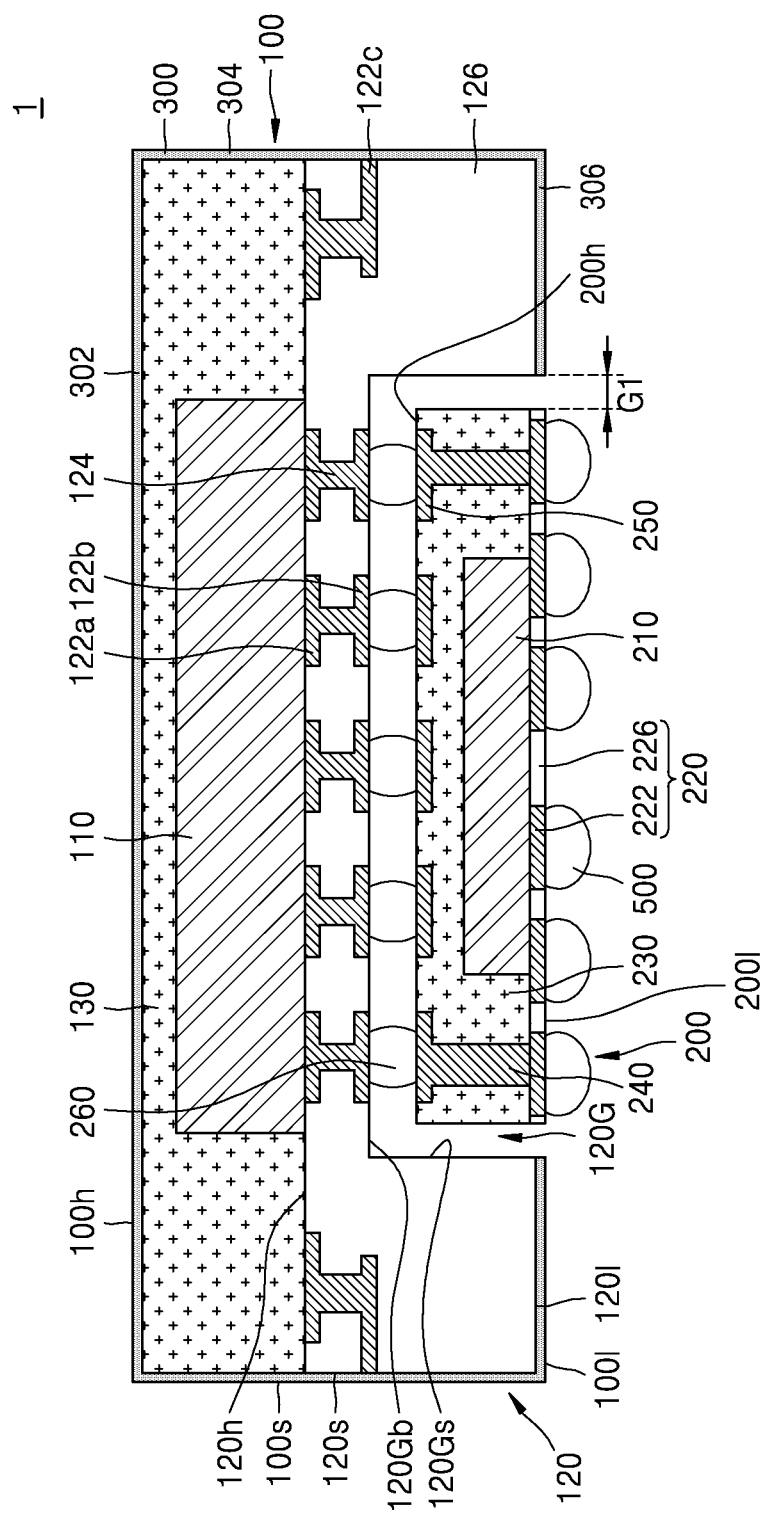
FIG. 1 is a cross-sectional view of a semiconductor package according to an exemplary embodiment.

Hereinafter, one or more exemplary embodiments will be described in detail in conjunction with the accompanying drawings, wherein like reference numerals refer to like elements throughout. As used herein, the term "and/or" includes any and all combinations of one or more of the associated listed items. Similarly, expressions such as "at least one of," when preceding a list of elements, modify the entire list of elements and do not modify the individual elements of the list.

FIG. 1 is a cross-sectional view of a semiconductor package 1 according to an exemplary embodiment.

Referring to FIG. 1, the semiconductor package 1 includes a first sub-package 100 and a second sub-package 200. The semiconductor package 1 may have a package on package (PoP) structure in which the first sub-package 100 is disposed on the second sub-package 200. The first sub-package 100 and the second sub-package 200 may be respectively referred to as an upper sub-package and a lower sub-package.

The first sub-package 100 includes a first semiconductor chip 110 and a first package base substrate 120 on which the first semiconductor chip 110 is mounted. The first semiconductor chip 110 may be, for example, mounted on a top surface 120h of the first package base substrate 120. The first sub-package 100 may have a groove space 120G extending inward from a bottom surface 100l of the first sub-package 100. The groove space 120G may extend into the first package base substrate 120 from a bottom surface 120l of the first package base substrate 120. The depth of the groove space 120G may have a value smaller or less than the thickness of the first package base substrate 120, i.e., a distance between the top surface 120h and the bottom surface 120l of the first package base substrate 120.

Herein, the bottom surface 100l of the first sub-package 100 denotes a bottom surface of the first sub-package 100 where the groove space 120G is not formed, i.e., the lowest surface of the first sub-package 100.

The first semiconductor chip 110 may include a semiconductor substrate. The semiconductor substrate may include, for example, silicon (Si). Alternatively, the semiconductor substrate may include a semiconductor element, such as germanium (Ge), or a compound semiconductor, such as silicon carbide (SiC), gallium arsenide (GaAs), indium arsenide (InAs), or indium phosphide (InP). Alternatively, the semiconductor substrate may have a silicon on insulator (SOI) structure. For example, the semiconductor substrate may include a buried oxide (BOX) layer. The semiconductor substrate may include a conductive region, for example, an impurity-doped well. The semiconductor substrate may have any one of various device isolation structures, such as a shallow trench isolation (STI) structure. The semiconductor substrate may have an active surface and an inactive surface opposite to the active surface.

The first semiconductor chip 110 may include a semiconductor device including one or more of various types of a plurality of individual devices, on the active surface. The plurality of individual devices may include various microelectronic devices, for example, a metal-oxide-semiconductor field effect transistor (MOSFET) such as a complementary metal-insulator-semiconductor (CMOS) transistor, a system large scale integration (LSI), an image sensor such as a CMOS imaging sensor (CIS), a micro-electro-mechanical system (MEMS), an active device, and a passive device. The plurality of individual devices may be electrically connected to the conductive region of the semiconductor substrate. The semiconductor device may further include a conductive wire or a conductive plug electrically connecting at least two of the plurality of individual devices or the plurality of individual devices and the conductive region of the semiconductor substrate. Also, the plurality of individual devices may be electrically isolated from other neighboring individual devices by an insulating film.

The first semiconductor chip 110 may include a plurality of first semiconductor pads disposed on the active surface. The first semiconductor chip 110 may be electrically connected to the first package base substrate 120 by a first connection terminal connecting the plurality of first semiconductor pads and a first chip connection pad 122a of the first package base substrate 120.

According to one or more exemplary embodiments, the first semiconductor chip 110 may be disposed on the top surface 120h of the first package base substrate 120 via a flip-chip manner in which the active surface faces the first package base substrate 120, and the first connection terminal may be, for example, a solder ball or a bump.

According to one or more other exemplary embodiments, the first semiconductor chip 110 may be disposed on the top surface 120h of the first package base substrate 120 such that the inactive surface faces the first package base substrate 120, and the first connection terminal may be, for example, a bonding wire.

In FIG. 1, the first sub-package 100 includes one first semiconductor chip 110. However, it is understood that one or more other exemplary embodiments are not limited thereto. For example, the first sub-package 100 may include a plurality of the first semiconductor chips 110 stacked in a vertical direction or disposed in a horizontal direction on the first package base substrate 120.

The first semiconductor chip 110 may be, for example, a memory semiconductor chip. Examples of the memory semiconductor chip include non-volatile memory semiconductor chips, such as a flash memory, a phase-change random access memory (PRAM), a magnetoresistive random access memory (MRAM), a ferroelectric random access memory (FeRAM), and a resistive random access memory (RRAM). The flash memory may be a V-NAND flash memory.

According to one or more exemplary embodiments, the first package base substrate 120 may be a printed circuit board. For example, the first package base substrate 120 may be a double-sided printed circuit board. According to one or more exemplary embodiments, the first package base substrate 120 may be a multi-layer printed circuit board.

The first package base substrate 120 may include the first chip connection pad 122a, a first package connection pad 122b, an electromagnetic wave shielding terminal 122c, and a first base layer 126.

The first base layer 126 may be formed of at least one material selected from phenol resin, epoxy resin, and polyimide. For example, the first base layer 126 may include at least one material selected from flame retardant 4 (FR4), tetrafunctional epoxy, polyphenylene ether, epoxy/polyphenylene oxide, bismaleimide triazine (BT), thermount, cyanate ester, polyimide, and liquid crystal polymer. The first base layer 126 may extend inward from a bottom surface of the first base layer 126 of the groove space 120G.

The first chip connection pad 122a may be disposed on the top surface 120h of the first package base substrate 120, The first package connection pad 122b may be disposed at a portion of the first package base substrate 120 at a lower surface 120Gb of the groove space 120G. The electromagnetic wave shielding terminal 122c may be provided at a side surface 120s of the first package base substrate 120.

In FIG. 1, the electromagnetic wave shielding terminal 122c is disposed approximately at the center of the side surface 120s of the first package base substrate 120. However, it is understood that one or more other exemplary embodiments are not limited thereto. According to one or more other exemplary embodiments, the electromagnetic wave shielding terminal 122c may be disposed at a portion of the side surface 120s contacting the top surface 120h of the first package base substrate 120, or at a portion of the side surface 120s contacting the bottom surface 120l of the first package base substrate 120.

The first chip connection pad 122a may be electrically connected to the first semiconductor chip 110 through the first connection terminal. The first package connection pad 122b may be electrically connected to the second sub-package 200 through an inter-package connection terminal 260. The electromagnetic wave shielding terminal 122c may contact an electromagnetic wave shielding member 300.

A first internal conductive layer 124 connecting the first chip connection pad 122a, the first package connection pad 122b, and/or the electromagnetic wave shielding terminal 122c may be disposed in the first package base substrate 120. A portion of the first internal conductive layer 124 may have a wire pattern extending in a horizontal direction, and another portion may be a conductive via extending in a vertical direction.

Each of the first chip connection pad 122a, the first package connection pad 122b, the electromagnetic wave shielding terminal 122c, and the first internal conductive layer 124 may be formed of or include, for example, at least one of copper, nickel, aluminum, stainless steel, or a copper alloy.

The first sub-package 100 may further include a first molding member 130. The first molding member 130 may be formed of, for example, silica filter-containing epoxy-series material. The first molding member 130 may surround the first semiconductor chip 110. The first molding member 130 may cover, for example, the top surface 120h of the first package base substrate 120 and side and top surfaces of the first semiconductor chip 110. According to one or more exemplary embodiments, the first molding member 130 may be an exposed type mold that covers the side surface of the first semiconductor chip 110 while not covering the top surface of the first semiconductor chip 110.

The electromagnetic wave shielding member 300 may be provided on a top surface 100h, the bottom surface 100l, and a side surface 100s of the first sub-package 100. For example, the electromagnetic wave shielding member 300 may cover the top and side surfaces of the first molding member 130, and the side and bottom surfaces 120s and 120l of the first package base substrate 120. The electromagnetic wave shielding member 300 may cover the entire surface of the first sub-package 100 excluding an inner side surface 120Gs and the lower surface 120Gb of the groove space 120G. According to one or more exemplary embodiments, when the first molding member 130 is an exposed type mold, the electromagnetic wave shielding member 300 may also cover a top surface of the first semiconductor chip 110.

The second sub-package 200 may be disposed in the groove space 120G. The side surface of the second sub-package 200 and the inner side surface 120Gs of the groove space 120G may be spaced apart from each other by a first distance G1.

The second sub-package 200 may be disposed in the groove space 120G while not protruding out from the groove space 120G. According to one or more exemplary embodiments, the second sub-package 200 may be disposed in the groove space 120G such that a bottom surface 200l of the second sub-package 200 and the bottom surface 100l of the first sub-package 100 are approximately at the same level (i.e., height). According to one or more exemplary embodiments, when an external connection terminal 500 attached to the bottom surface 200l of the second sub-package 200 sufficiently protrudes out from the groove space 120G, the bottom surface 200l of the second sub-package 200 may be located at a higher level than the bottom surface 100l of the first sub-package 100, in the groove space 120G.

The second sub-package 200 includes a second semiconductor chip 210 and a second package base substrate 220 on which the second semiconductor chip 210 is mounted.

Since the second semiconductor chip 210 is similar to the first semiconductor chip 110, details thereof are not repeated herein. The second semiconductor chip 210 may be, for example, disposed on a top surface of the second package base substrate 220 in a flip-chip manner in which an active surface faces the second package base substrate 220.

According to one or more exemplary embodiments, the second semiconductor chip 210 may be a central processing unit (CPU), a micro processor unit (MPU), a graphic processor unit (GPU), or an application processor (AP). According to one or more exemplary embodiments, the second semiconductor chip 210 may be a controller chip for controlling the first semiconductor chip 110. According to one or more exemplary embodiments, the second semiconductor chip 210 may be a volatile memory semiconductor chip, such as a dynamic random access memory (DRAM) or a static random access memory (SRAM). Alternatively, according to one or more exemplary embodiments, there may be a plurality of the second semiconductor chips 210 including, for example, a controller semiconductor chip for controlling the first semiconductor chip 110 and a volatile memory semiconductor chip.

The second package base substrate 220 may include a plurality of second connection pads 222 and a second base layer 226. The second connection pads 222 may be respectively disposed on top and bottom surfaces of the second base layer 226, but in the present specification, the second package base substrate 220 is simply illustrated for convenience. Some of the plurality of second connection pads 222 disposed on the top surface of the second base layer 226 may be electrically connected to the second semiconductor chip 210 by a second connection terminal, and others of the plurality of second connection pads 222 disposed on the top surface of the second base layer 226 may be connected to a through mold via 240. Some of the plurality of second connection pads 222 disposed on the bottom surface of the second base layer 226 may be connected to the external connection terminal 500. The second connection terminal may be, for example, a solder ball, a bump, or a bonding wire.

The second sub-package 200 may further include a second molding member 230. The second molding member 230 may surround the second semiconductor chip 210. The second molding member 230 may cover, for example, the top surface of the second package base substrate 220 and the side and top surfaces of the second semiconductor chip 210.

A second package connection pad 250 is disposed on a top surface 200h of the second sub-package 200, i.e., on the top surface of the second molding member 230. The through mold via 240 connecting the second package connection pad 250 and the second connection pad 222 may be formed in the second molding member 230. According to one or more exemplary embodiments, the second connection pad 222 may be connected to the through mold via 240 through a re-wiring layer formed on the top surface 200h of the second sub-package 200.

The inter-package connection terminal 260 may be attached to the second package connection pad 250. The top and bottom portions of the inter-package connection terminal 260 may respectively contact the first package connection pad 122b and the second package connection pad 250.

The external connection terminal 500 may be attached to the bottom surface 200l of the second sub-package 200. The external connection terminal 500 may be attached to some of the plurality of second connection pads 222, which are disposed on the bottom surface of the second base layer 226. All or at least a portion of the external connection terminal 500 may be located outside the groove space 120G.

The electromagnetic wave shielding member 300 may include a top portion 302 formed or provided on the top surface 100h of the first sub-package 100, a side portion 304 formed or provided on the side surface 100s, and a bottom portion 306 formed or provided on the bottom surface 100l.

The electromagnetic wave shielding member 300 may be formed or provided on a surface of the first sub-package 100 via a conformal shielding method. The electromagnetic wave shielding member 300 may be formed of a conductive material. The electromagnetic wave shielding member 300 may be formed of, for example, a metal material, such as silver (Ag), copper (Cu), nickel (Ni), aluminum (Al), tin (Sn), or stainless steel, a conductive carbon material, such as carbon black, carbon nanotube (CNT), or graphite, a metal coated material, such as Ag/Cu, Ag/glass fiber, or Ni/graphite, or a conductive polymer material, such as polypyrrole or polyaniline.

The electromagnetic wave shielding member 300 may contact the electromagnetic wave shielding terminal 122c. For example, the side portion 304 of the electromagnetic wave shielding member 300 may contact the electromagnetic wave shielding terminal 122c.

Since a general PoP type semiconductor package has a structure in which an upper sub-package is stacked on a lower sub-package, a gap exists at a side surface of the semiconductor package due to an inter-package connection terminal connecting the lower sub-package and the upper sub-package. Accordingly, electromagnetic waves may be emitted from inside the semiconductor package through the gap between the lower sub-package and the upper sub-package by forming an electromagnetic wave shielding member on a surface of the semiconductor package. Also, the inter-package connection terminal may be disconnected when a metal material forming the electromagnetic wave shielding member penetrates through the gap between the lower sub-package and the upper sub-package.

However, in the semiconductor package 1 according to an exemplary embodiment, the second sub-package 200 is disposed in the groove space 120G of the first sub-package 100. Thus, there is no gap between the first sub-package 100 and the second sub-package 200 at the side surface 100s of the semiconductor package 1. Accordingly, electromagnetic waves emitted from the inside of the semiconductor package 1 may be blocked by the electromagnetic wave shielding member 300 formed on the surface of the first sub-package 100. Also, since the electromagnetic wave shielding member 300 has the bottom portion 306 that covers the bottom surface 100l of the first sub-package 100, electromagnetic waves may be prevented from being externally emitted from the first sub-package 100 through the bottom surface 100l of the first sub-package 100. Accordingly, an electronic device including the semiconductor package 1 is prevented from malfunctioning due to noise caused by the electromagnetic waves emitted from the semiconductor package 1, and thus reliability of the electronic device including the semiconductor package 1 may be increased.

Also, in the semiconductor package 1 according to an exemplary embodiment, since the electromagnetic wave shielding member 300 is formed only on the surface of the first sub-package 100, disconnection of the inter-package connection terminal 260 caused by the metal material forming the electromagnetic wave shielding member 300 may not occur. Accordingly, connection reliability between the first sub-package 100 and the second sub-package 200 may be increased in the semiconductor package 1 of a PoP type in which the first sub-package 100 is disposed on the second sub-package 200.

Figure 2:
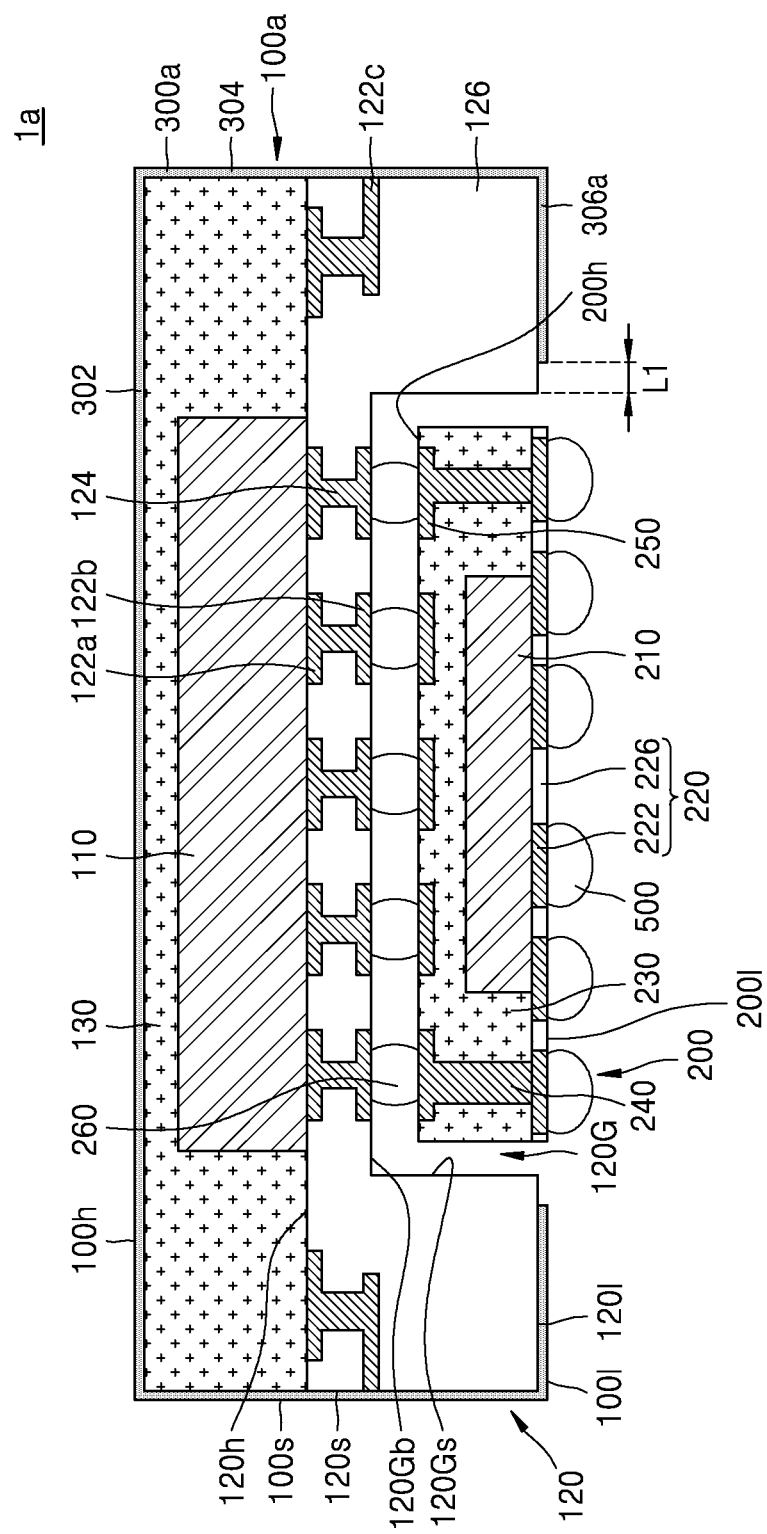
FIG. 2 is a cross-sectional view of a semiconductor package according to another exemplary embodiment.

FIG. 2 is a cross-sectional view of a semiconductor package 1a according to another exemplary embodiment. Details of FIG. 2, which overlap those of FIG. 1, may not be provided again.

Referring to FIG. 2, the semiconductor package 1a includes a first sub-package 100a and the second sub-package 200. The semiconductor package 1a may be a PoP type in which the first sub-package 100a is disposed on the second sub-package 200.

The first sub-package 100a includes the first semiconductor chip 110 and the first package base substrate 120 on which the first semiconductor chip 110 is mounted. The first semiconductor chip 110 may be mounted, for example, on the top surface 120h of the first package base substrate 120. The first sub-package 100a may have the groove space 120G extending inward from the bottom surface 100l of the first sub-package 100.

The first package base substrate 120 may include the first chip connection pad 122a, the first package connection pad 122b, the electromagnetic wave shielding terminal 122c, and the first base layer 126.

The first chip connection pad 122a may be electrically connected to the first semiconductor chip 110. The first package connection pad 122b may be electrically connected to the second sub-package 200 through the inter-package connection terminal 260. The electromagnetic wave shielding terminal 122c may contact an electromagnetic wave shielding member 300a.

The first sub-package 100a may further include the first molding member 130. The first molding member 130 may cover, for example, the top surface 120h of the first package base substrate 120 and the side and top surfaces of the first semiconductor chip 110.

The electromagnetic wave shielding member 300a may be formed or provided on the top surface 100h, the bottom surface 100l, and the side surface 100s of the first sub-package 100a. The electromagnetic wave shielding member 300a may not cover the inner side surface 120Gs and the lower surface 120Gb of the groove space 120G. The electromagnetic wave shielding member 300a may cover all of the top and side surfaces of the first molding member 130 and the side surface 120s of the first package base substrate 120, may cover a portion of the bottom surface 120l of the first package base substrate 120, and may not cover the remaining portion of the bottom surface 120l.

The electromagnetic wave shielding member 300a may include the top portion 302 formed or provided on the top surface 100h of the first sub-package 100a, the side portion 304 formed or provided on the side surface 100s, and a bottom portion 306a formed or provided on the bottom surface 100l. The bottom portion 306a of the electromagnetic wave shielding member 300a may not cover a portion of the bottom surface 120l of the first package base substrate 120, which is adjacent to the groove space 120G. An end portion (i.e., an end) of the bottom portion 306a of the electromagnetic wave shielding member 300a, which faces the groove space 120G, may be spaced apart from the groove space 120G by a second distance L1.

The second sub-package 200 may be disposed in the groove space 120G. The side surface of the second sub-package 200 and the inner side surface 120Gs of the groove space 120G may be spaced apart from each other without contact.

The second sub-package 200 may be disposed in the groove space 120G without protruding out from the groove space 120G.

The second sub-package 200 may include the second semiconductor chip 210, the second package base substrate 220 on which the second semiconductor chip 210 is mounted, and the second molding member 230. The second molding member 230 may surround the second semiconductor chip 210.

The second package connection pad 250 is disposed on the top surface 200h of the second sub-package 200. The through mold via 240 connecting the second package connection pad 250 and the second connection pad 222 may be formed in the second molding member 230.

The inter-package connection terminal 260 may be attached to the second package connection pad 250. The top and bottom portions of the inter-package connection terminal 260 may respectively contact the first package connection pad 122b and the second package connection pad 250.

The external connection terminal 500 may be attached to the second connection pad 222 at the bottom surface 200l of the second sub-package 200. All of at least a portion of the external connection terminal 500 may be located outside the groove space 120G.

Figure 3:
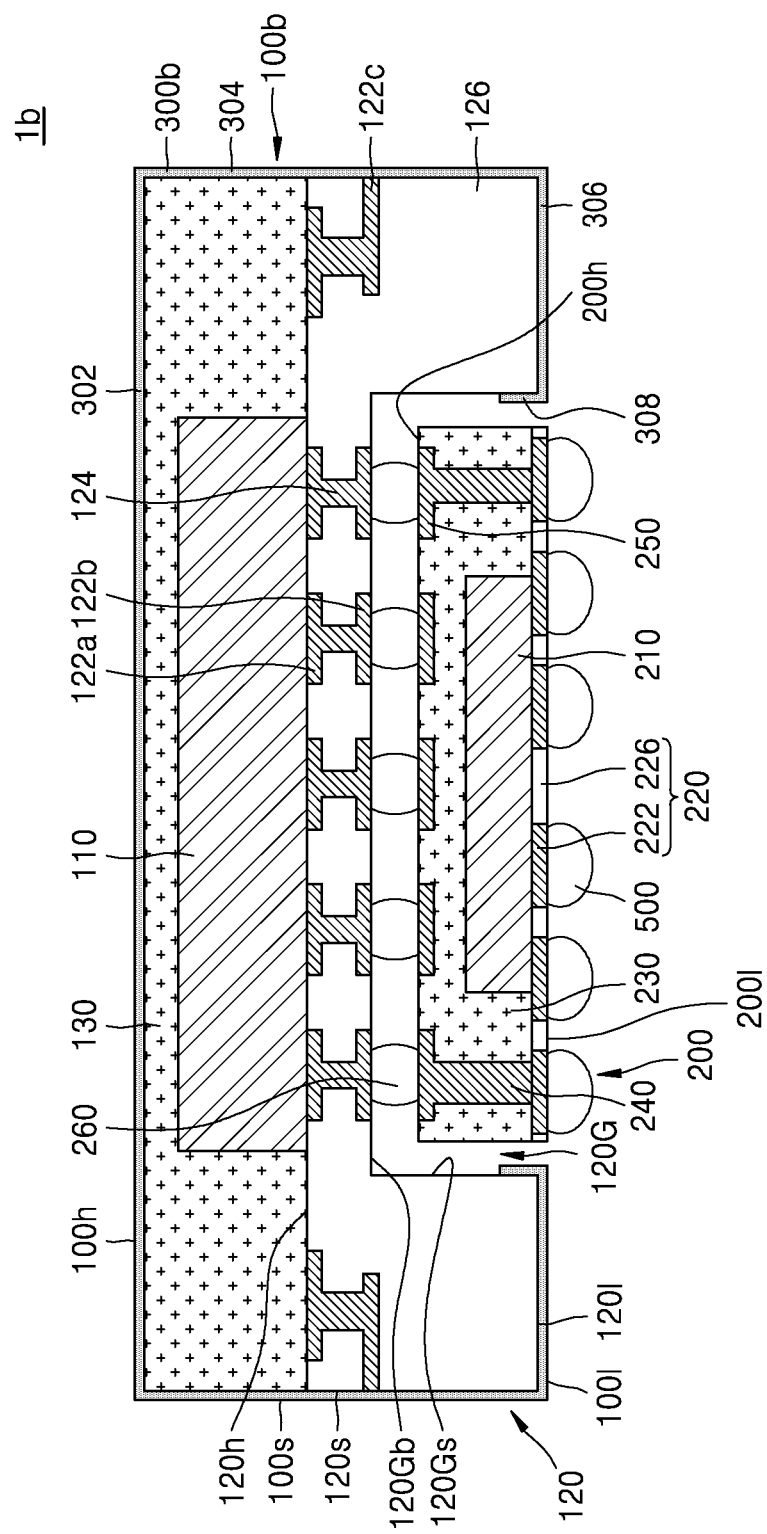
FIG. 3 is a cross-sectional view of a semiconductor package according to another exemplary embodiment.

FIG. 3 is a cross-sectional view of a semiconductor package 1b according to another exemplary embodiment. Details of FIG. 3, which overlap those of FIG. 1, may not be provided again.

Referring to FIG. 3, the semiconductor package 1b includes a first sub-package 100b and the second sub-package 200. The semiconductor package 1b may be a PoP type in which the first sub-package 100b is disposed on the second sub-package 200.

The first sub-package 100b includes the first semiconductor chip 110, and the first package base substrate 120 on which the first semiconductor chip 110 is mounted. The first semiconductor chip 110 may be, for example, mounted on the top surface 120h of the first package base substrate 120. The first sub-package 100b may have the groove space 120G extending inward from the bottom surface 100l of the first sub-package 100b.

The first package base substrate 120 may include the first chip connection pad 122a, the first package connection pad 122b, the electromagnetic wave shielding terminal 122c, and the first base layer 126.

The first chip connection pad 122a may be electrically connected to the first semiconductor chip 110. The first package connection pad 122b may be electrically connected to the second sub-package 200 through the inter-package connection terminal 260. The electromagnetic wave shielding terminal 122c may contact an electromagnetic wave shielding member 300b.

The first sub-package 100b may further include the first molding member 130. The first molding member 130 may cover, for example, the top surface 120h of the first package base substrate 120 and the side and top surfaces of the first semiconductor chip 110.

The electromagnetic wave shielding member 300b may be formed or provided on the top surface 100h, the bottom surface 100l, and the side surface 100s of the first sub-package 100b, and the inner side surface 120Gs of the groove space 120G. The electromagnetic wave shielding member 300b may not cover a portion of the inner side surface 120Gs and all of the lower surface 120Gb of the groove space 120G. The electromagnetic wave shielding member 300b may cover the top and side surfaces of the first molding member 130 and all of the side and bottom surfaces 120s and 120l of the first package base substrate 120, may cover a portion of the inner side surface 120Gs of the groove space 120G, and may not cover the remaining portion of the inner side surface 120Gs.

The electromagnetic wave shielding member 300b may include the top portion 302 formed or provided on the top surface 100h of the first sub-package 100b, the side portion 304 formed or provided on the side surface 100s, the bottom portion 306 formed or provided on the bottom surface 100l, and an inner side portion 308 formed or provided on the inner side surface 120Gs of the groove space 120G. The inner side portion 308 of the electromagnetic wave shielding member 300b may extend from the bottom portion 306 to cover a portion of the inner side surface 120Gs of the groove space 120G, but may not extend up to the lower surface 120Gb. In other words, the inner side portion 308 of the electromagnetic wave shielding member 300b may extend from the bottom surface 120l of the first package base substrate 120 along the inner side surface 120Gs of the groove space 120G, while having a length smaller or less than the depth of the groove space 120G.

The second sub-package 200 may be disposed in the groove space 120G. The side surface of the second sub-package 200 and the inner side surface 120Gs of the groove space 120G may be spaced apart from each other without contact.

The second sub-package 200 may be disposed in the groove space 120G without protruding out from the groove space 120G.

The second sub-package 200 may include the second semiconductor chip 210, the second package base substrate 220 on which the second semiconductor chip 210 is mounted, and the second molding member 230. The second molding member 230 may surround the second semiconductor chip 210.

The second package connection pad 250 is disposed on the top surface 200h of the second sub-package 200. The through mold via 240 connecting the second package connection pad 250 and the second connection pad 222 may be formed or provided in the second molding member 230.

The inter-package connection terminal 260 may be attached to the second package connection pad 250. The top and bottom portions of the inter-package connection terminal 260 may respectively contact the first package connection pad 122b and the second package connection pad 250.

The external connection terminal 500 may be attached to the second connection pad 222 at the bottom surface 200l of the second sub-package 200. All or at least a portion of the external connection terminal 500 may be located outside the groove space 120G.

Figure 4:
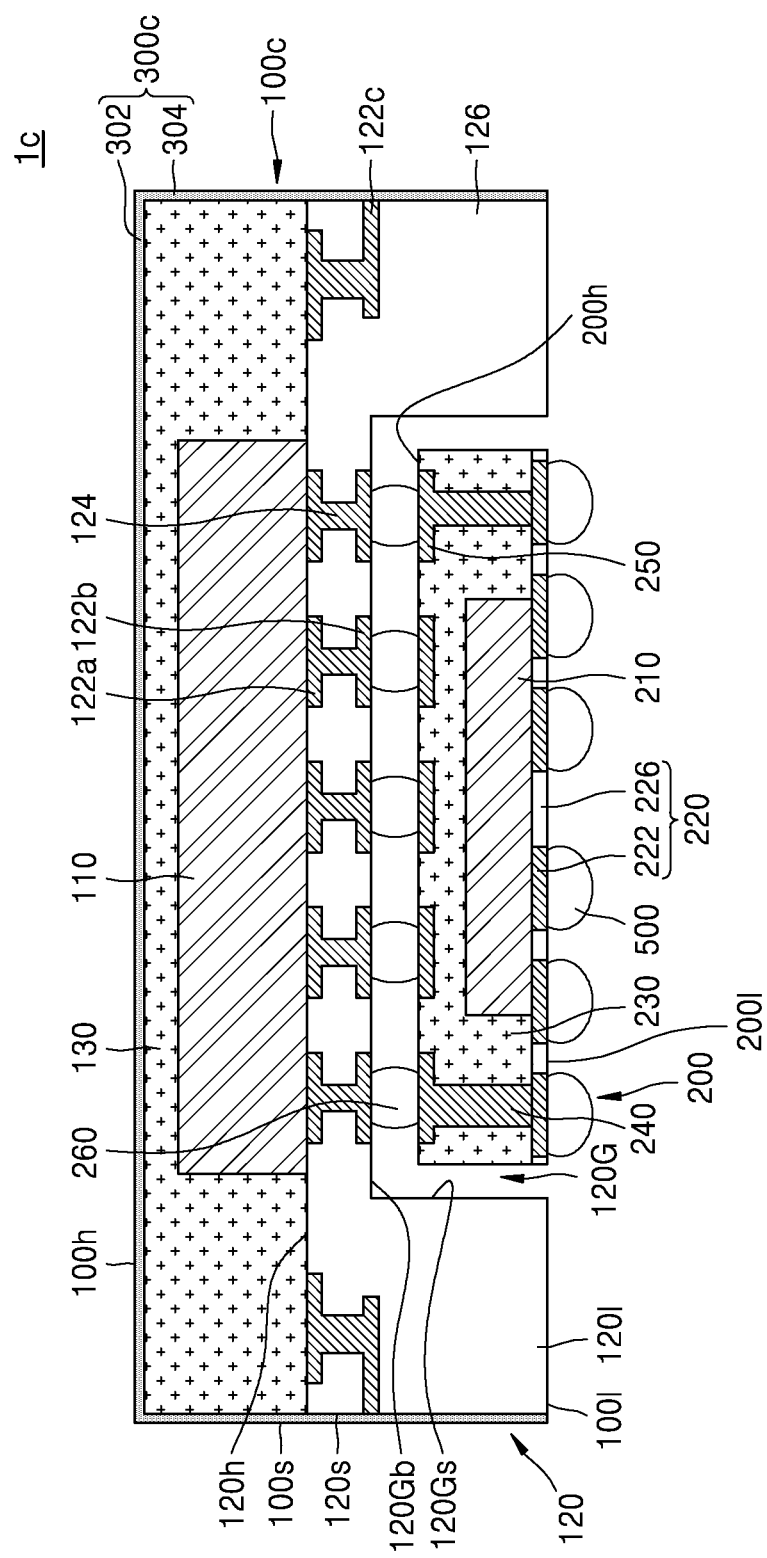
FIG. 4 is a cross-sectional view of a semiconductor package according to another exemplary embodiment.

FIG. 4 is a cross-sectional view of a semiconductor package 1c according to another exemplary embodiment. Details of FIG. 4, which overlap those of FIG. 1, may not be provided again.

Referring to FIG. 4, the semiconductor package 1c includes a first sub-package 100c and the second sub-package 200. The semiconductor package 1c may be a PoP type in which the first sub-package 100c is disposed on the second sub-package 200.

The first sub-package 100c includes the first semiconductor chip 110, and the first package base substrate 120 on which the first semiconductor chip 110 is mounted. The first semiconductor chip 110 may be, for example, mounted on the top surface 120*h* of the first package base substrate 120. The first sub-package 100*c* may have the groove space 120G extending inward from the bottom surface 100*l* of the first sub-package 100*c*.

The first package base substrate 120 may include the first chip connection pad 122*a*, the first package connection pad 122*b*, the electromagnetic wave shielding terminal 122*c*, and the first base layer 126.

The first chip connection pad 122*a* may be electrically connected to the first semiconductor chip 110. The first package connection pad 122*b* may be electrically connected to the second sub-package 200 through the inter-package connection terminal 260. The electromagnetic wave shielding terminal 122*c* may contact an electromagnetic wave shielding member 300*c*.

The first sub-package 100*c* may further include the first molding member 130. The first molding member 130 may cover, for example, the top surface 120*h* of the first package base substrate 120 and the side and top surfaces of the first semiconductor chip 110.

The electromagnetic wave shielding member 300*c* may be formed or provided on the top surface 100*h* and the side surface 100*s* of the first sub-package 100*c*. The electromagnetic wave shielding member 300*c* may not cover the bottom surface 100*l* of the first sub-package 100*c*, i.e., the bottom surface 120*l* of the first package base substrate 120 and the inner side surface 120Gs and the lower surface 120Gb of the groove space 120G. The electromagnetic wave shielding member 300*c* may cover the top and side surfaces of the first molding member 130 and all of the side surface 120*s* of the first package base substrate 120, and may not cover all of the bottom surface 101 of the first package base substrate 120, and the inner side surface 120Gs and the lower surface 120Gb of the groove space 120G.

The electromagnetic wave shielding member 300*b* may include the top portion 302 formed on the top surface 100*h* of the first sub-package 100*b* and the side portion 304 formed on the side surface 100*s*.

The second sub-package 200 may be disposed in the groove space 120G. The side surface of the second sub-package 200 and the inner side surface 120Gs of the groove space 120G may be spaced apart from each other without contact.

The second sub-package 200 may be disposed in the groove space 120G without protruding out from the groove space 120G.

The second sub-package 200 may include the second semiconductor chip 210, the second package base substrate 220 on which the second semiconductor chip 210 is mounted, and the second molding member 230. The second molding member 230 may surround the second semiconductor chip 210.

The second package connection pad 250 is disposed on the top surface 200*h* of the second sub-package 200. The through mold via 240 connecting the second package connection pad 250 and the second connection pad 222 may be formed in the second molding member 230.

The inter-package connection terminal 260 may be attached to the second package connection pad 250. The top and bottom portions of the inter-package connection terminal 260 may respectively contact the first package connection pad 122*b* and the second package connection pad 250.

The external connection terminal 500 may be attached to the second connection pad 222 at the bottom surface 200*l* of the second sub-package 200. All or at least a portion of the external connection terminal 500 may be located outside the groove space 120G.

Figure 5:
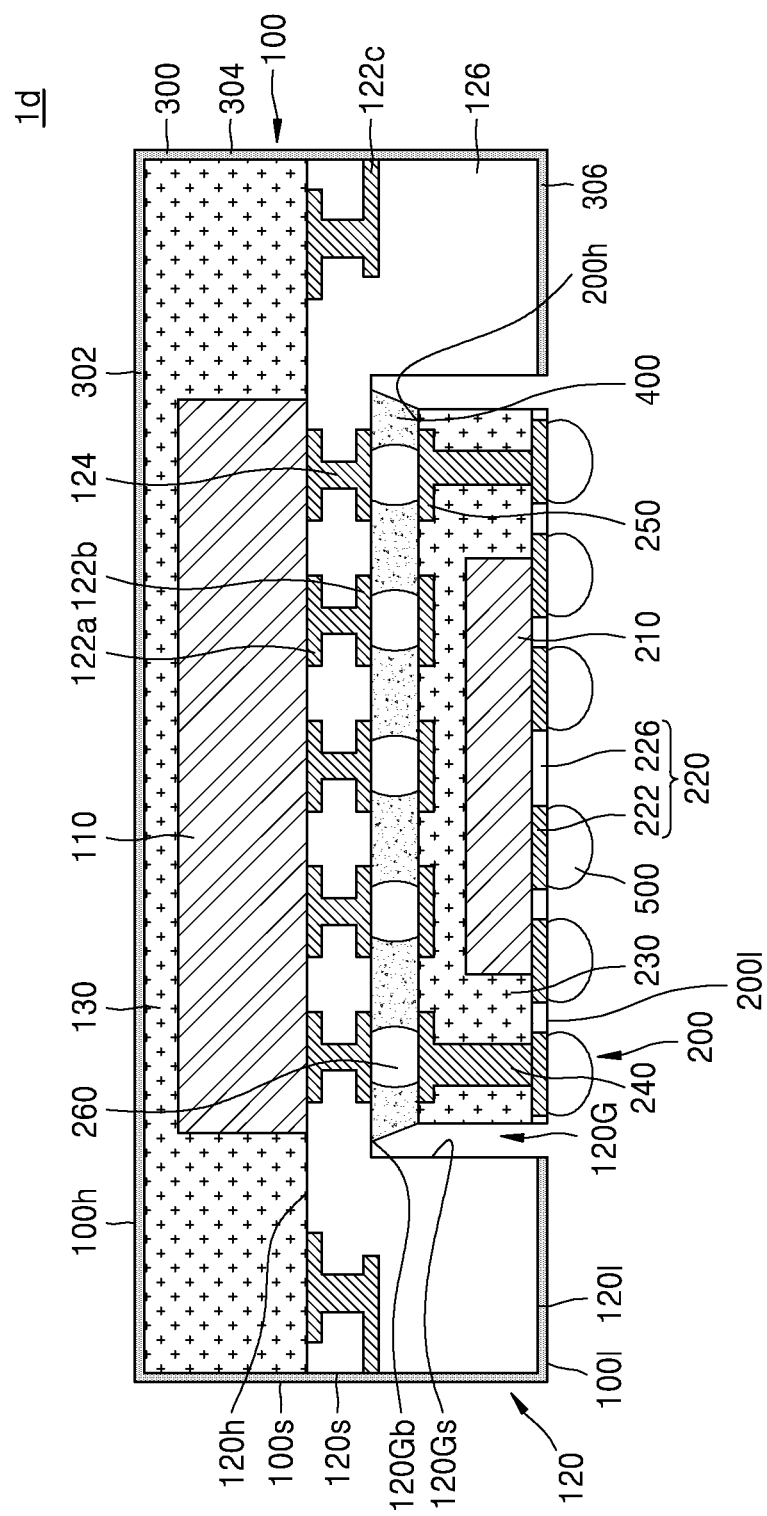
FIG. 5 is a cross-sectional view of a semiconductor package according to another exemplary embodiment.

FIG. 5 is a cross-sectional view of a semiconductor package 1*d* according to another exemplary embodiment. Details of FIG. 5, which overlap those of FIG. 1, may not be provided again.

Referring to FIG. 5, the semiconductor package 1*d* includes the first sub-package 100 and the second sub-package 200. The semiconductor package 1*d* may be a PoP type in which the first sub-package 100 is disposed on the second sub-package 200.

The first sub-package 100 includes the first semiconductor chip 110, and the first package base substrate 120 on which the first semiconductor chip 110 is mounted. The first semiconductor chip 110 may be, for example, mounted on the top surface 120*h* of the first package base substrate 120. The first sub-package 100 may have the groove space 120G extending inward from the bottom surface 100*l* of the first sub-package 100.

The first package base substrate 120 may include the first chip connection pad 122*a*, the first package connection pad 122*b*, the electromagnetic wave shielding terminal 122*c*, and the first base layer 126.

The first chip connection pad 122*a* may be electrically connected to the first semiconductor chip 110. The first package connection pad 122*b* may be electrically connected to the second sub-package 200 through the inter-package connection terminal 260. The electromagnetic wave shielding terminal 122*c* may contact the electromagnetic wave shielding member 300.

The first sub-package 100 may further include the first molding member 130. The first molding member 130 may cover, for example, the top surface 120*h* of the first package base substrate 120 and the side and top surfaces of the first semiconductor chip 110.

The electromagnetic wave shielding member 300 may be formed or provided on the top surface 100*h*, the bottom surface, and the side surface 100*s* of the first sub-package 100. In detail, the electromagnetic wave shielding member 300 may cover the top and side surfaces of the first molding member 130, and the side and bottom surfaces 120*s* and 120*l* of the first package base substrate 120. The electromagnetic wave shielding member 300 may cover all of the surface of the first sub-package 100 excluding the inner side surface 120Gs and the lower surface 120Gb of the groove space 120G.

The electromagnetic wave shielding member 300 may include the top portion 302 formed or provided on the top surface 100*h* of the first sub-package 100, the side portion 304 formed or provided on the side surface 100*s*, and the bottom portion 306 formed or provided on the bottom surface 100*l*.

The second sub-package 200 may be disposed in the groove space 120G. The side surface of the second sub-package 200 and the inner side surface 120Gs of the groove space 120G may be spaced apart from each other without contact.

The second sub-package 200 may be disposed in the groove space 120G without protruding out from the groove space 120G.

The second sub-package 200 may include the second semiconductor chip 210, the second package base substrate 220 on which the second semiconductor chip 210 is mounted, and the second molding member 230. The second molding member 230 may surround the second semiconductor chip 210.

The second package connection pad 250 is disposed on the top surface 200h of the second sub-package 200. The through mold via 240 connecting the second package connection pad 250 and the second connection pad 222 may be formed or provided in the second molding member 230.

The inter-package connection terminal 260 may be attached to the second package connection pad 250. The top and bottom portions of the inter-package connection terminal 260 may respectively contact the first package connection pad 122b and the second package connection pad 250.

An under-fill layer 400 surrounding the inter-package connection terminal 260 may be formed or provided between the top surface 200h of the second sub-package 200 and the lower surface 120Gb of the groove space 120G.

The external connection terminal 500 may be attached to the second connection pad 222 at the bottom surface 200l of the second sub-package 200. All or at least a portion of the external connection terminal 500 may be located outside the groove space 120G.

Figure 6:
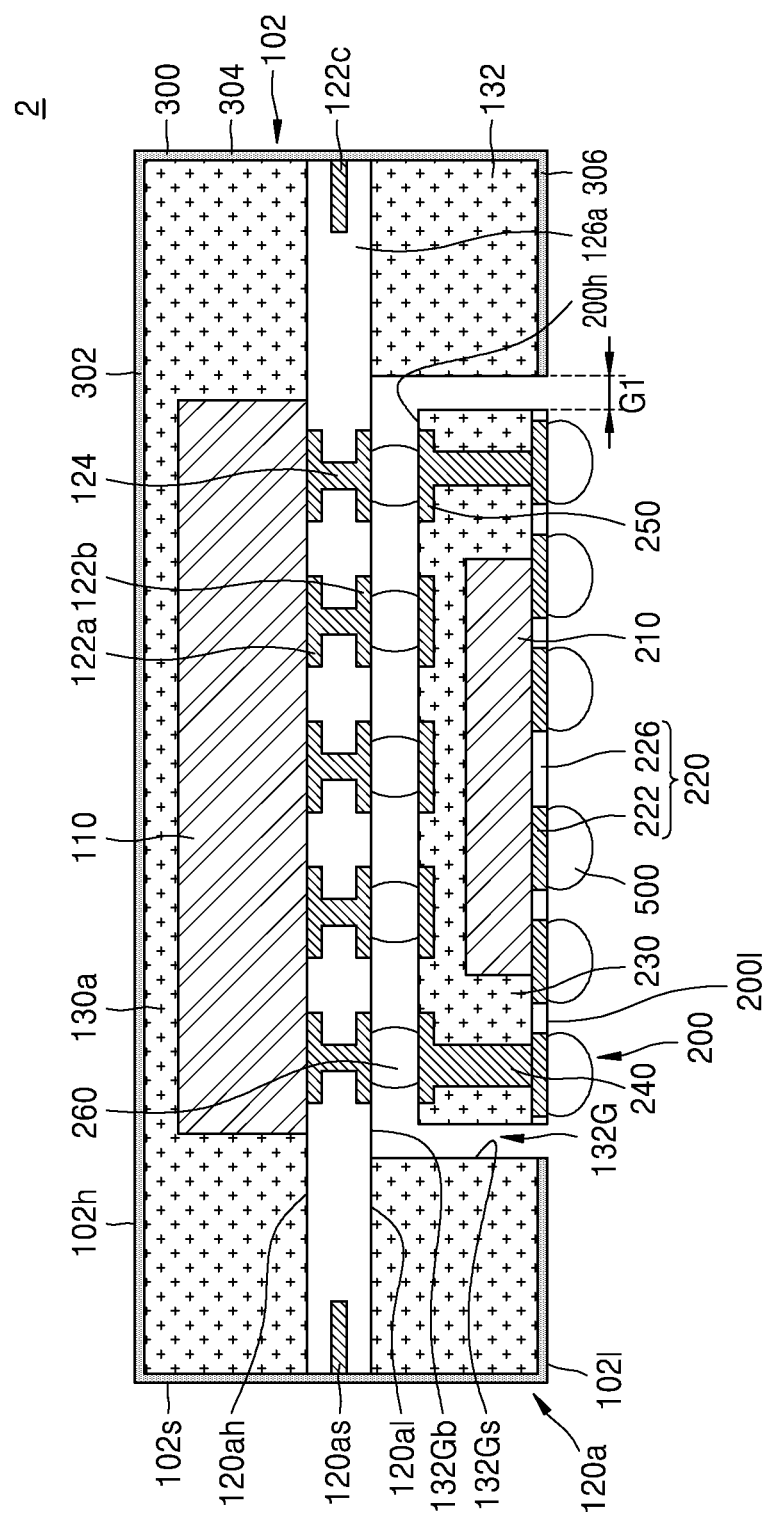
FIG. 6 is a cross-sectional view of a semiconductor package according to another exemplary embodiment.

FIG. 6 is a cross-sectional view of a semiconductor package 2 according to another exemplary embodiment. Details of FIG. 6, which overlap those of FIG. 1, may not be provided again.

Referring to FIG. 6, the semiconductor package 2 includes a first sub-package 102 and the second sub-package 200. The semiconductor package 2 may be a PoP type in which the first sub-package 102 is disposed on the second sub-package 200.

The first sub-package 102 includes the first semiconductor chip 110 and a first package base substrate 120a on which the first semiconductor chip 110 is mounted. The first semiconductor chip 110 may be, for example, mounted on a top surface 120ah of the first package base substrate 120a. The first sub-package 102 may have a groove space 132G extending inward from a bottom surface 102l of the first sub-package 102.

The first package base substrate 120a may include the first chip connection pad 122a, the first package connection pad 122b, the electromagnetic wave shielding terminal 122c, and a first base layer 126a.

The first chip connection pad 122a may be electrically connected to the first semiconductor chip 110. The first package connection pad 122b may be electrically connected to the second sub-package 200 through the inter-package connection terminal 260. The electromagnetic wave shielding terminal 122c may contact the electromagnetic wave shielding member 300.

The first sub-package 102 may further include a first upper molding member 130a and a first lower molding member 132. The first upper molding member 130a may cover, for example, the top surface 120ah of the first package base substrate 120a, and the side and top surfaces of the first semiconductor chip 110. The first lower molding member 132 may include, for example, a portion of a bottom surface 120al of the first package base substrate 120a. The groove space 132G may be defined by the bottom surface 120al of the first package base substrate 120a and the first lower molding member 132. At least a portion of the bottom surface 120al of the first package base substrate 120a may be exposed on a lower surface 132Gb of the groove space 132G. In other words, the groove space 132G may be a space where the first lower molding member 132 is not formed between the bottom surface 120al of the first package base substrate 120a and the bottom surface 102l of the first sub-package 102. The depth of the groove space 132G may be a value approximately the same as the height of the first lower molding member 132.

The electromagnetic wave shielding member 300 may be formed or provided on a top surface 102h, the bottom surface 102l, and a side surface 102s of the first sub-package 102. For example, the electromagnetic wave shielding member 300 may cover the top and side surfaces of the first upper molding member 130a, a side surface 120as of the first package base substrate 120a, and the side and bottom surfaces of the first lower molding member 132. The electromagnetic wave shielding member 300 may cover all of the surface of the first sub-package 102 excluding an inner side surface 132Gs and the lower surface 132Gb of the groove space 132G.

The electromagnetic wave shielding member 300 may include the top portion 302 formed or provided on the top surface 102h of the first sub-package 102, the side portion 304 formed or provided on the side surface 102s, and the bottom portion 306 formed or provided on the bottom surface 102l.

The second sub-package 200 may be disposed in the groove space 132G. The side surface of the second sub-package 200 and the inner side surface 132Gs of the groove space 132G may be spaced apart from each other without contact.

The second sub-package 200 may be disposed in the groove space 132G while not protruding out from the groove space 132G.

The second sub-package 200 may include the second semiconductor chip 210, the second package base substrate 220 on which the second semiconductor chip 210 is mounted, and the second molding member 230. The second molding member 230 may surround the second semiconductor chip 210.

The second package connection pad 250 is disposed on the top surface 200h of the second sub-package 200. The through mold via 240 connecting the second package connection pad 250 and the second connection pad 222 may be formed or provided in the second molding member 230.

The inter-package connection terminal 260 may be attached to the second package connection pad 250. The top and bottom portions of the inter-package connection terminal 260 may respectively contact the first package connection pad 122b and the second package connection pad 250.

The external connection terminal 500 may be attached to the second connection pad 222 at the bottom surface 200l of the second sub-package 200. All or at least a portion of the external connection terminal 500 may be located outside the groove space 132G.

Figure 7:
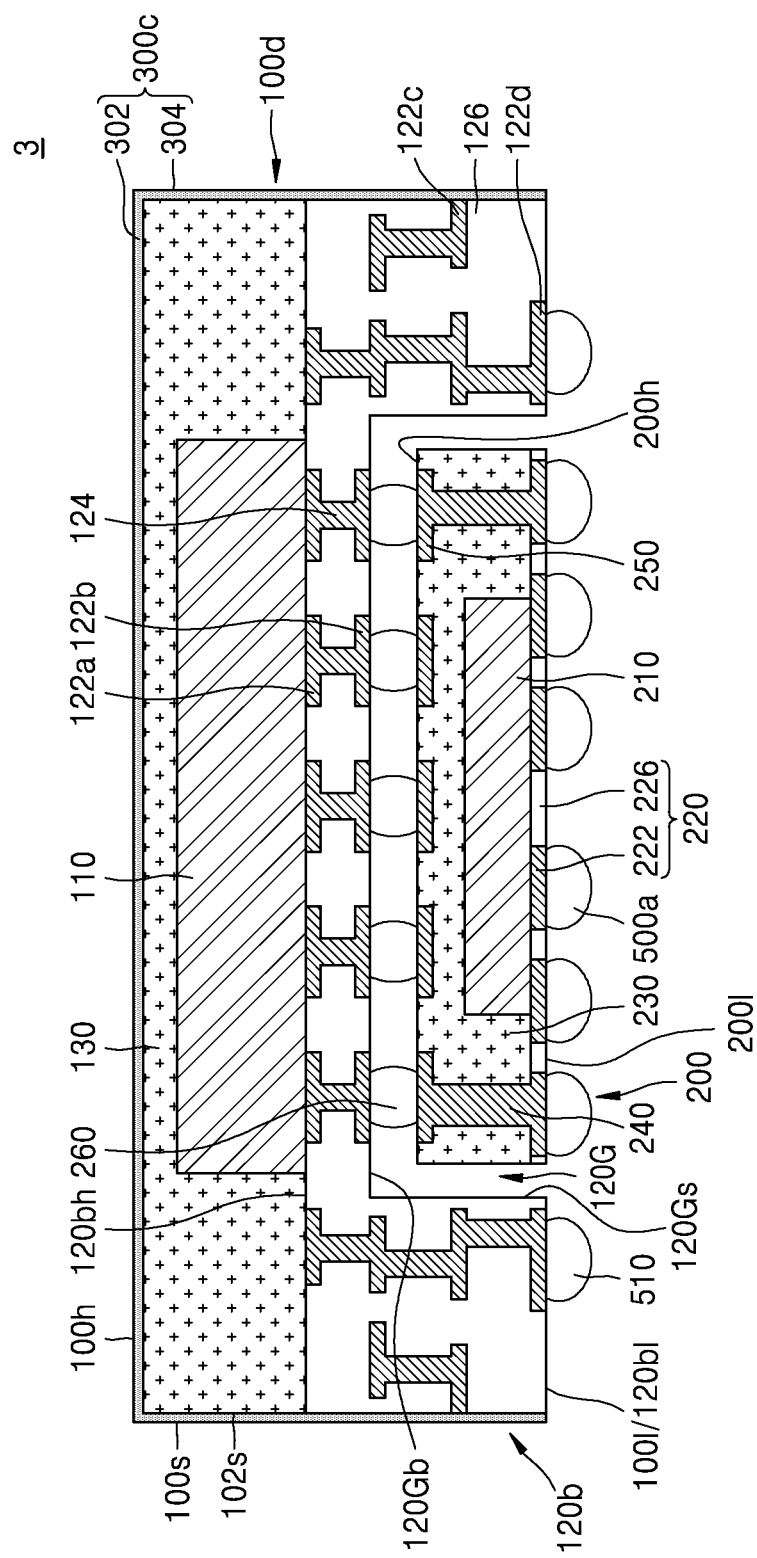
FIG. 7 is a cross-sectional view of a semiconductor package according to another exemplary embodiment.

FIG. 7 is a cross-sectional view of a semiconductor package 3 according to another exemplary embodiment. Details of FIG. 7, which overlap those of FIGS. 1 and 4, may not be provided again.

Referring to FIG. 7, the semiconductor package 3 includes a first sub-package 100d and the second sub-package 200. The semiconductor package 3 may be a PoP type in which the first sub-package 100d is disposed on the second sub-package 200.

The first sub-package 100d includes the first semiconductor chip 110 and a first package base substrate 120b on which the first semiconductor chip 110 is mounted. The first semiconductor chip 110 may be mounted, for example, on a top surface 120bh of the first package base substrate 120b. The first sub-package 100d may have the groove space 120G extending inward from the bottom surface 100l of the first sub-package 100d.

The first package base substrate 120b may include the first chip connection pad 122a, the first package connection pad 122b, the electromagnetic wave shielding terminal 122c, an external connection pad 122*d*, and the first base layer 126. The external connection pad 122*d* may be disposed on a bottom surface of the first sub-package 100*d*, i.e., a bottom surface 120*bl* of the first package base substrate 120*b*.

The first chip connection pad 122*a* may be electrically connected to the first semiconductor chip 110. The first package connection pad 122*b* may be electrically connected to the second sub-package 200 through the inter-package connection terminal 260. The electromagnetic wave shielding terminal 122*c* may contact the electromagnetic wave shielding member 300*c*.

The first sub-package 100*d* may further include the first molding member 130. The first molding member 130 may cover, for example, the top surface 120*bh* of the first package base substrate 120*b* and the side and top surfaces of the first semiconductor chip 110.

The electromagnetic wave shielding member 300*c* may be formed or provided on the top surface 100*h* and the side surface 100*s* of the first sub-package 100*d*. The electromagnetic wave shielding member 300*c* may not cover the bottom surface 100*l* of the first sub-package 100*d*, i.e., the bottom surface 120*bl* of the first package base substrate 120*b*, and the inner side surface 120Gs and the lower surface 120Gb of the groove space 120G. The electromagnetic wave shielding member 300*c* may cover the top and side surfaces of the first molding member 130 and all of a side surface 120*bs* of the first package base substrate 120*b*, while not covering all of the bottom surface 120*bl* of the first package base substrate 120*b*, and the inner side surface 120Gs and the lower surface 120Gb of the groove space 120G.

The electromagnetic wave shielding member 300*c* may include the top portion 302 formed or provided on the top surface 100*h* of the first sub-package 100*d* and the side portion 304 formed or provided on the side surface 100*s*.

The second sub-package 200 may be disposed in the groove space 120G. The side surface of the second sub-package 200 and the inner side surface 120Gs of the groove space 120G may be spaced apart from each other without contact.

The second sub-package 200 may be disposed in the groove space 120G without protruding out from the groove space 120G.

The second sub-package 200 may include the second semiconductor chip 210, the second package base substrate 220 on which the second semiconductor chip 210 is mounted, and the second molding member 230. The second molding member 230 may surround the second semiconductor chip 210.

The second package connection pad 250 may be disposed on the top surface 200*h* of the second sub-package 200. The through mold via 240 connecting the second package connection pad 250 and the second connection pad 222 may be formed or provided in the second molding member 230.

The inter-package connection terminal 260 may be attached to the second package connection pad 250. The top and bottom portions of the inter-package connection terminal 260 may respectively contact the first package connection pad 122*b* and the second package connection pad 250.

A first external connection terminal 500*a* may be attached to the second connection pad 222 at the bottom surface 200*l* of the second sub-package 200. All or at least a portion of the first external connection terminal 500*a* may be located outside the groove space 120G. A second external connection terminal 510 may be attached to the bottom surface 100*l* of the first sub-package 100*d*.

Figure 8:
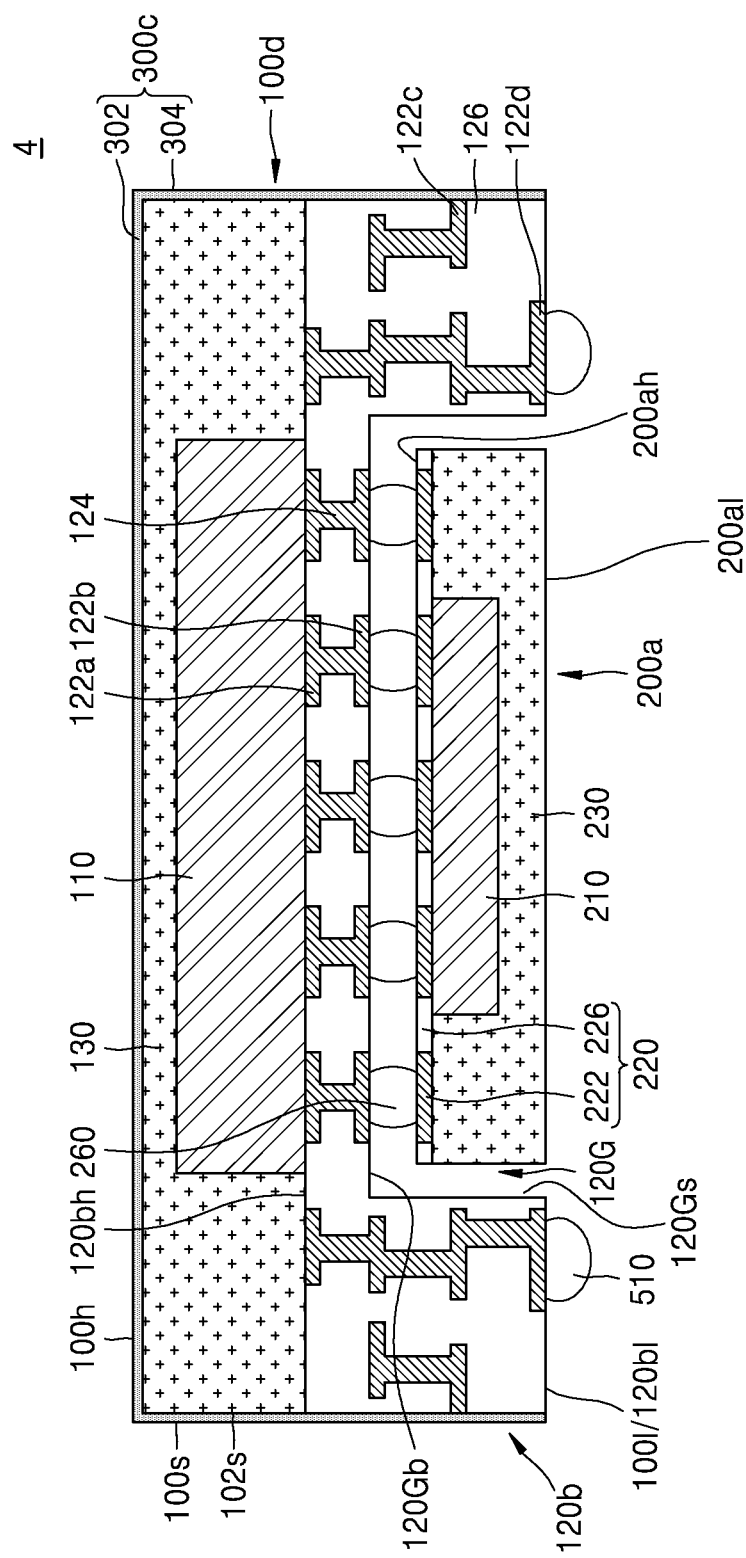
FIG. 8 is a cross-sectional view of a semiconductor package according to another exemplary embodiment.

FIG. 8 is a cross-sectional view of a semiconductor package 4 according to another exemplary embodiment. Details of FIG. 8, which overlap those of FIGS. 1 and 7, may not be provided again.

Referring to FIG. 8, the semiconductor package 4 includes the first sub-package 100*d* and a second sub-package 200*a*. The semiconductor package 4 may be a PoP type in which the first sub-package 100*d* is disposed on the second sub-package 200*a*.

The first sub-package 100*d* includes the first semiconductor chip 110 and the first package base substrate 120*b* on which the first semiconductor chip 110 is mounted. The first semiconductor chip 110 may be mounted, for example, on the top surface 120*bh* of the first package base substrate 120*b*. The first sub-package 100*d* may have the groove space 120G extending inward from the bottom surface 100*l* of the first sub-package 100*d*.

The first package base substrate 120*b* may include the first chip connection pad 122*a*, the first package connection pad 122*b*, the electromagnetic wave shielding terminal 122*c*, the external connection pad 122*d*, and the first base layer 126.

The first chip connection pad 122*a* may be electrically connected to the first semiconductor chip 110. The first package connection pad 122*b* may be electrically connected to the second sub-package 200*a* through the inter-package connection terminal 260. The electromagnetic wave shielding terminal 122*c* may contact the electromagnetic wave shielding member 300*c*.

The first sub-package 100*d* may further include the first molding member 130. The first molding member 130 may cover, for example, the top surface 120*bh* of the first package base substrate 120*b* and the side and top surfaces of the first semiconductor chip 110.

The electromagnetic wave shielding member 300*c* may be formed or provided on the top surface 100*h* and the side surface 100*s* of the first sub-package 100*d*. The electromagnetic wave shielding member 300*c* may not cover the bottom surface 100*l* of the first sub-package 100*d*, i.e., the bottom surface 120*bl* of the first package base substrate 120, and the inner side surface 120Gs and the lower surface 120Gb of the groove space 120G. The electromagnetic wave shielding member 300*c* may cover all of the top and side surfaces of the first molding member 130 and the side surface 120*bs* of the first package base substrate 120*b*, while not covering all of the bottom surface 120*bl* of the first package base substrate 120*b* and the inner side surface 120Gs and the lower surface 120Gb of the groove space 120G.

The electromagnetic wave shielding member 300*c* may include the top portion 302 formed or provided on the top surface 100*h* of the first sub-package 100*d* and the side portion 304 formed or provided on the side surface 100*s*.

The second sub-package 200*a* may be disposed in the groove space 120G. The side surface of the second sub-package 200*a* and the inner side surface 120Gs of the groove space 120G may be spaced apart from each other without contact.

The second sub-package 200*a* may be disposed in the groove space 120G without protruding out from the groove space 120G.

The second sub-package 200*a* may include the second semiconductor chip 210, the second package base substrate 220 on which the second semiconductor chip 210 is mounted, and the second molding member 230. The second molding member 230 may surround the second semiconductor chip 210.

The second package base substrate 220 may include a plurality of the second connection pads 222 and the second base layer 226. The second connection pads 222 may be disposed at each of the top and bottom surfaces of the second base layer 226, but in the present specification, the second package base substrate 220 is simply illustrated for convenience. Some of the second connection pads 222 disposed on the top surface of the second base layer 226 may be electrically connected to the second semiconductor chip 210 by a second connection terminal, and some of the second connection pads 222 disposed on the bottom surface of the second base layer 226 may be connected to the inter-package connection terminal 260.

The second sub-package 200 may further include the second molding member 230. The second molding member 230 may surround the second semiconductor chip 210. The second molding member 230 may cover, for example, the top surface of the second package base substrate 220 and the side and top surfaces of the second semiconductor chip 210.

Some of the second connection pads 222 are disposed on a top surface 200ah of the second sub-package 200, i.e., the bottom surface of the second package base substrate 220.

The inter-package connection terminal 260 may be attached to the second connection pad 222 disposed on the top surface 200ah of the second sub-package 200. The top and bottom portions of the inter-package connection terminals 260 may respectively contact the first package connection pad 122b and the second connection pad 222.

The second molding member 230 may be exposed at a bottom surface 200a1 of the second sub-package 200.

FIGS. 9 through 12 are cross-sectional views sequentially illustrating processes of manufacturing a semiconductor package, according to an exemplary embodiment.

Referring to FIG. 9, the first package base substrate 120 is prepared. The first package base substrate 120 may include the first chip connection pad 122a, the first package connection pad 122b, the electromagnetic wave shielding terminal 122c, and the first base layer 126. The first package base substrate 120 may have the groove space 120G that extends from the bottom surface 120l into the first package base substrate 120, and exposing the first package connection pad 122b at the lower surface 120Gb.

Referring to FIG. 10, the first semiconductor chip 110 is mounted on the top surface 120h of the first package base substrate 120, and the first molding member 130 surrounding the first semiconductor chip 110 is formed or provided. The first molding member 130 may cover, for example, the top surface 120h of the first package base substrate 120 and the side and top surfaces of the first semiconductor chip 110. According to one or more exemplary embodiments, the first molding member 130 may be an exposed type mold that covers the side surface of the first semiconductor chip 110 while not covering the top surface of the first semiconductor chip 110.

Figure 12:
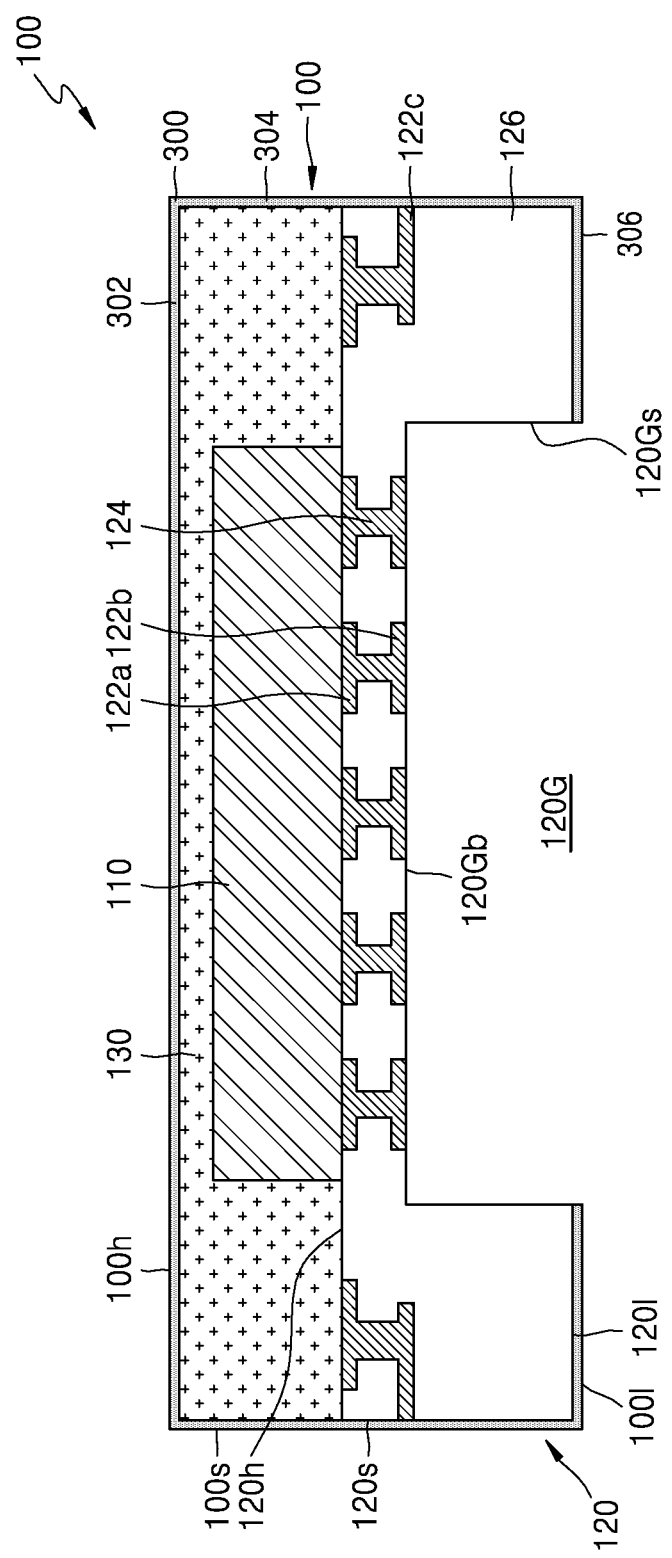

Referring to FIGS. 11 and 12 together, the first package base substrate 120 including the first semiconductor chip 110 and the first molding member 130 is disposed on a substrate plate 10, and then the first sub-package 100 including the electromagnetic wave shielding member 300 is formed or provided by providing an electromagnetic wave shield source S1. The bottom surface 120l of the first package base substrate 120 and a top surface of the substrate plate 10 may be spaced apart from each other by a separation distance GH. For example, in order to separate the bottom surface 120l of the first package base substrate 120 and the top surface of the substrate plate 10 by the separation distance GH, a support member may be present on a location of the substrate plate 10 corresponding to the groove space 120G.

The electromagnetic wave shielding member 300 may be formed, for example, via a physical vapor deposition (PVD) method. According to one or more exemplary embodiments, the electromagnetic wave shielding member 300 may be formed via a sputtering process. The electromagnetic wave shield source S1 may be, for example, a precursor for forming a metal material, a conductive carbon material, a metal coating material, or a conductive polymer material.

When the bottom surface 120l of the first package base substrate 120 and the top surface of the substrate plate 10 are spaced apart from each other, a portion of the electromagnetic wave shield source S1 may also be transmitted to the bottom surface 120l of the first package base substrate 120.

According to one or more exemplary embodiments, when the separation distance GH is adjusted such that the electromagnetic wave shield source S1 is transmitted to the bottom surface 120l of the first package base substrate 120 but not transmitted into the groove space 120G, the electromagnetic wave shielding member 300 may include the top portion 302 formed on the top surface 100h of the first sub-package 100, the side portion 304 formed on the side surface 100s, and the bottom portion 306 covering the entire bottom surface 100l.

According to one or more exemplary embodiments, when the separation distance GH is relatively short, the bottom portion 306a of the electromagnetic wave shielding member 300 may cover only a portion of the bottom surface 100l as shown in FIG. 2.

According to one or more exemplary embodiments, when the separation distance GH is relatively long, the electromagnetic wave shielding member 300b further including the inner side portion 308 formed on the inner side surface 120Gs of the groove space 120G may be formed as shown in FIG. 3.

Then, as shown in FIGS. 1 through 3, the semiconductor package 1, 1a, or 1b may be formed by disposing the second sub-package 200 in the groove space 120G, as shown in FIG. 1, 2, or 3.

The external connection terminal 500 of FIGS. 1 through 3 may be attached to the second sub-package 200 before the second sub-package 200 is disposed in the groove space 120G, or after the second sub-package 200 is disposed in the groove space 120G.

Figure 13:
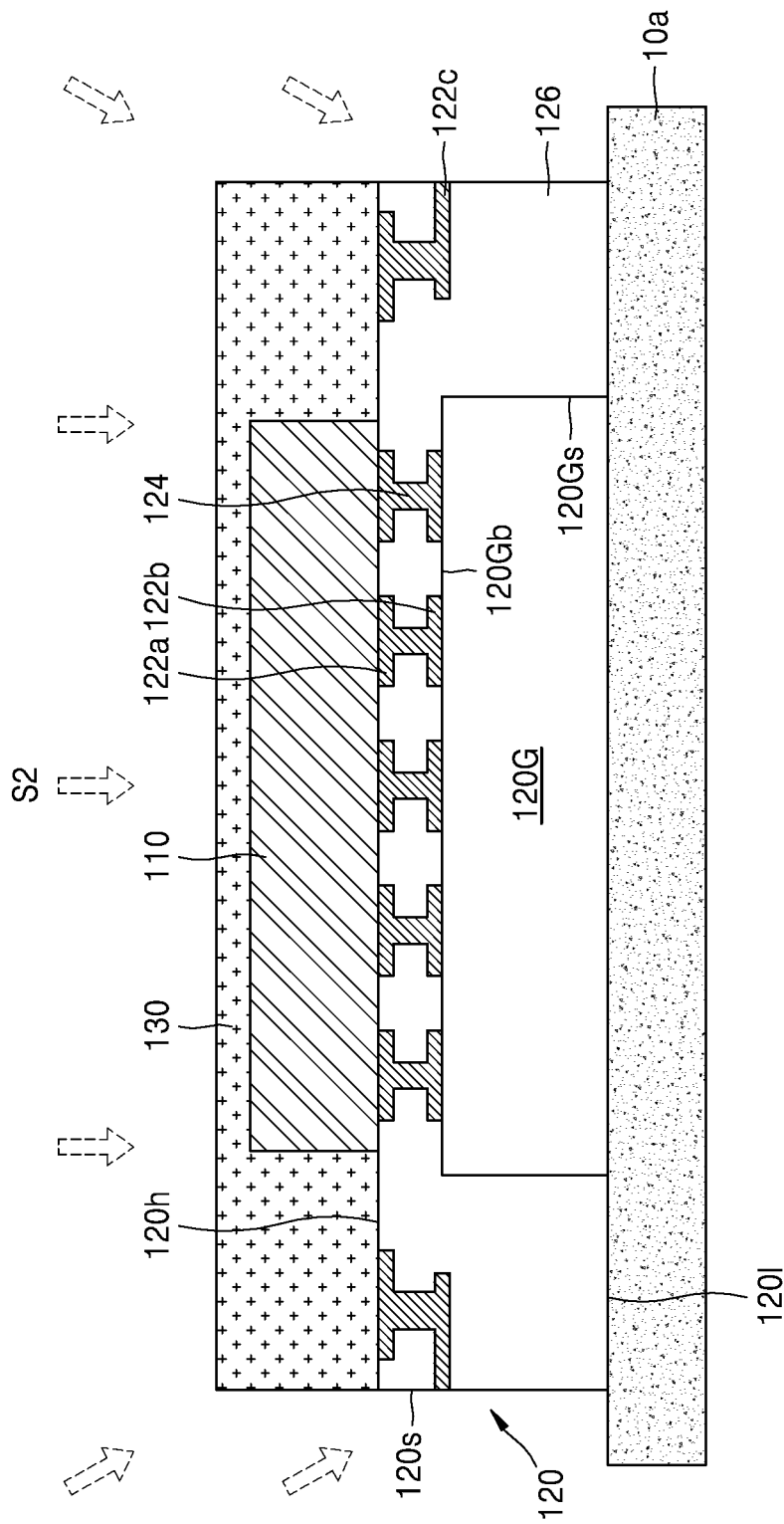
FIGS. 13 and 14 are cross-sectional views sequentially illustrating processes of manufacturing a semiconductor package, according to an exemplary embodiment.
Figure 14:
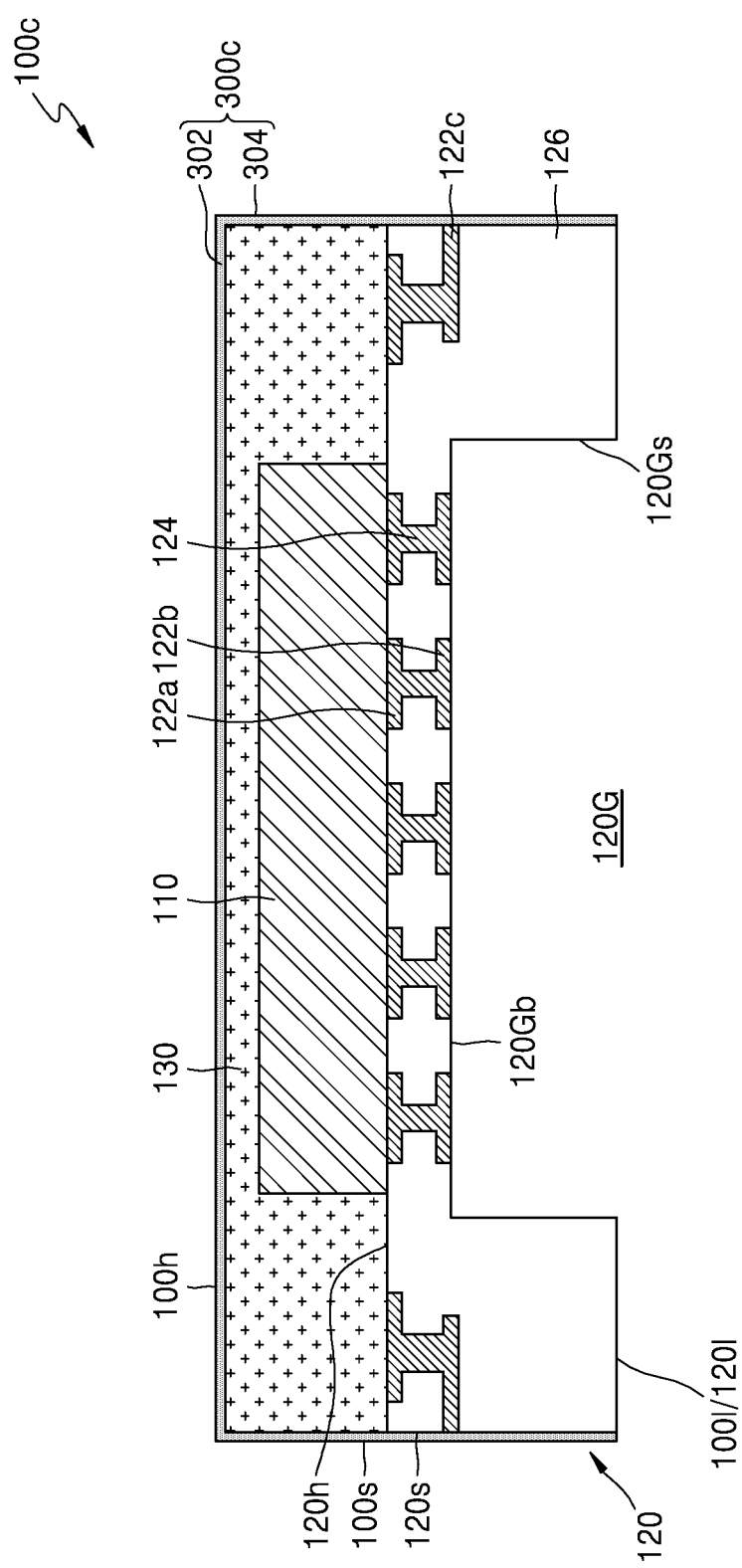

FIGS. 13 and 14 are cross-sectional views sequentially illustrating processes of manufacturing a semiconductor package, according to an exemplary embodiment.

Referring to FIGS. 13 and 14 together, the first package base substrate 120 including the first semiconductor chip 110 and the first molding member 130 is disposed on a substrate plate 10a, and then the first sub-package 100c including the electromagnetic wave shielding member 300c is formed by providing an electromagnetic wave shield source S2.

The bottom surface 120l of the first package base substrate 120 and the top surface of the substrate plate 10 may contact each other such that the electromagnetic wave shield source S2 is not transmitted to the bottom surface 102l of the first package base substrate 120 and into the groove space 120G.

Accordingly, the electromagnetic wave shielding member 300c may include the top portion 302 formed on the top surface 100h of the first sub-package 100c and the side portion 304 formed on the side surface 100s.

Figure 15:
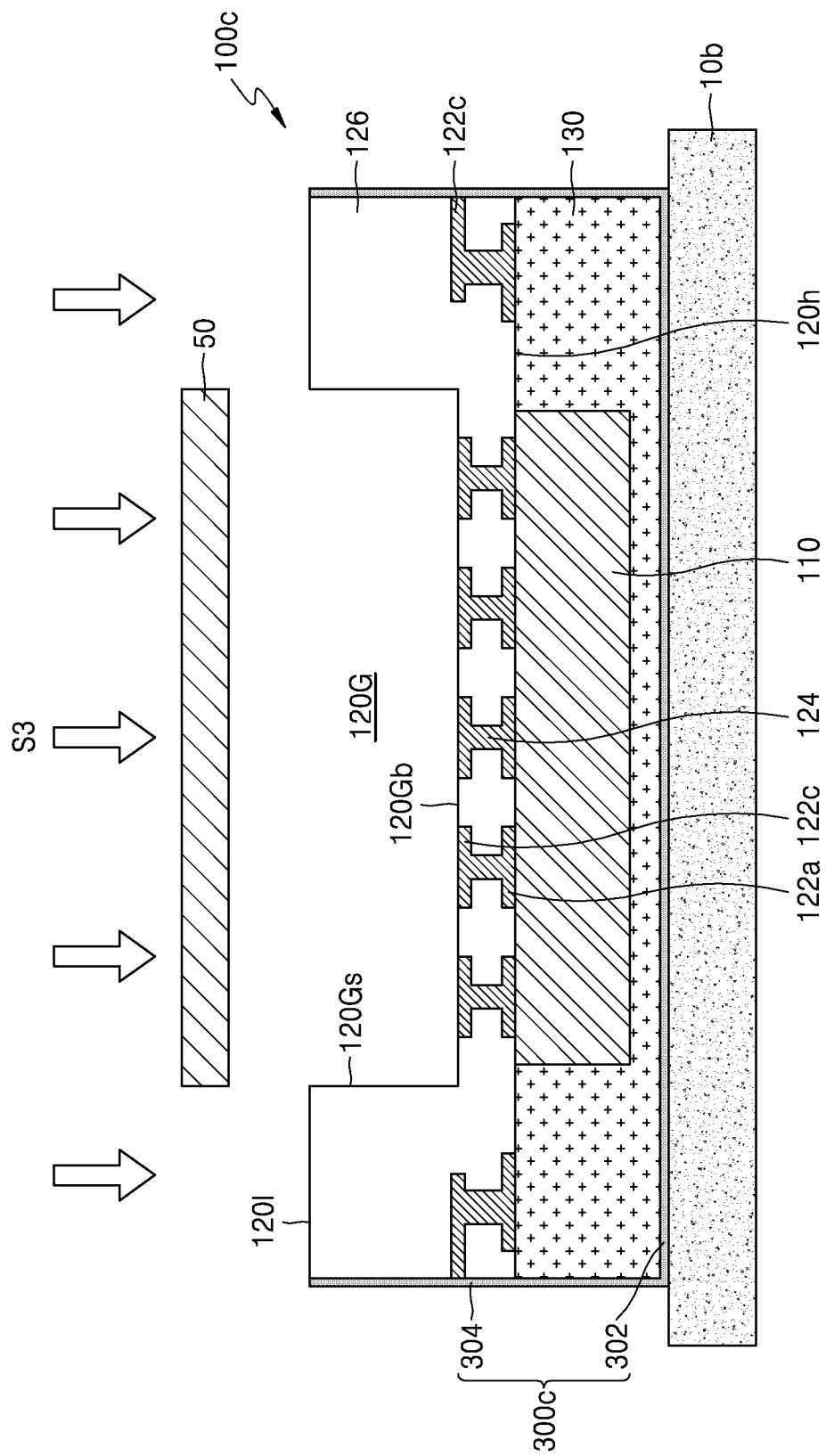
FIG. 15 is a cross-sectional view illustrating a process of manufacturing a semiconductor package, according to an exemplary embodiment.

FIG. 15 is a cross-sectional view illustrating a process of manufacturing a semiconductor package, according to an exemplary embodiment.

Referring to FIGS. 14 and 15 together, the first sub-package 100c is disposed on a substrate plate 10b such that the groove space 120G and the bottom surface 120l of the first package base substrate 120 face upward. Then, the first sub-package 100 including the electromagnetic wave shielding member 300 of FIG. 12 may be formed by providing an electromagnetic wave shield source S3 using a deposition mask 50 covering the groove space 120G.

The electromagnetic wave shielding member 300 may include the top portion 302 and the side portion 304 formed by using the electromagnetic wave shield source S2 described with reference to FIG. 13, and the bottom portion 306 formed by using the electromagnetic wave shield source S3 described with reference to FIG. 15.

According to one or more exemplary embodiments, by increasing or decreasing the area of the deposition mask 50, the electromagnetic wave shielding member 300a of FIG. 2 or the electromagnetic wave shielding member 300b of FIG. 3 may be formed.

Figure 16:
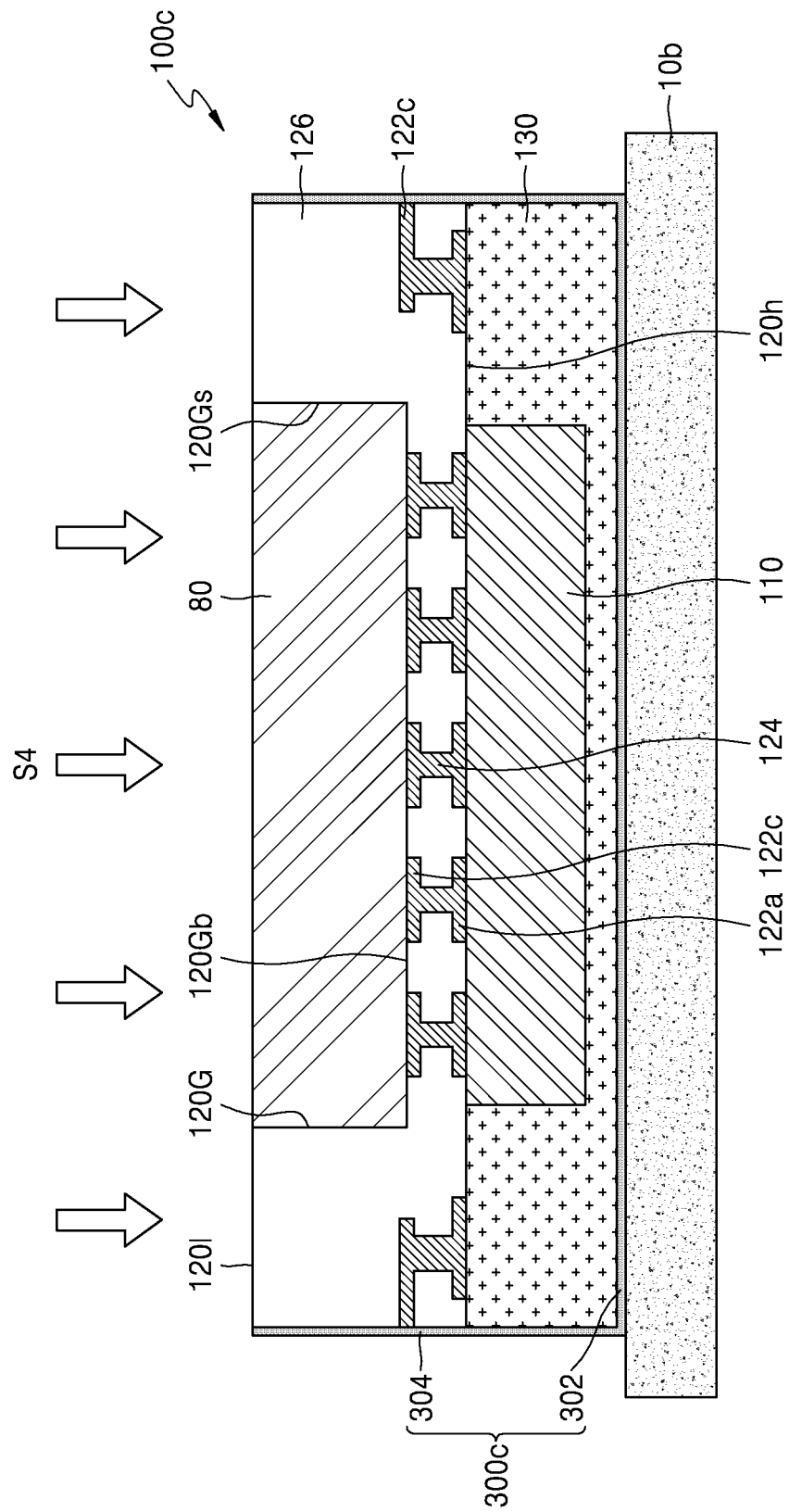
FIGS. 16 and 17 are cross-sectional views sequentially illustrating processes of manufacturing a semiconductor package, according to an exemplary embodiment.
Figure 17:
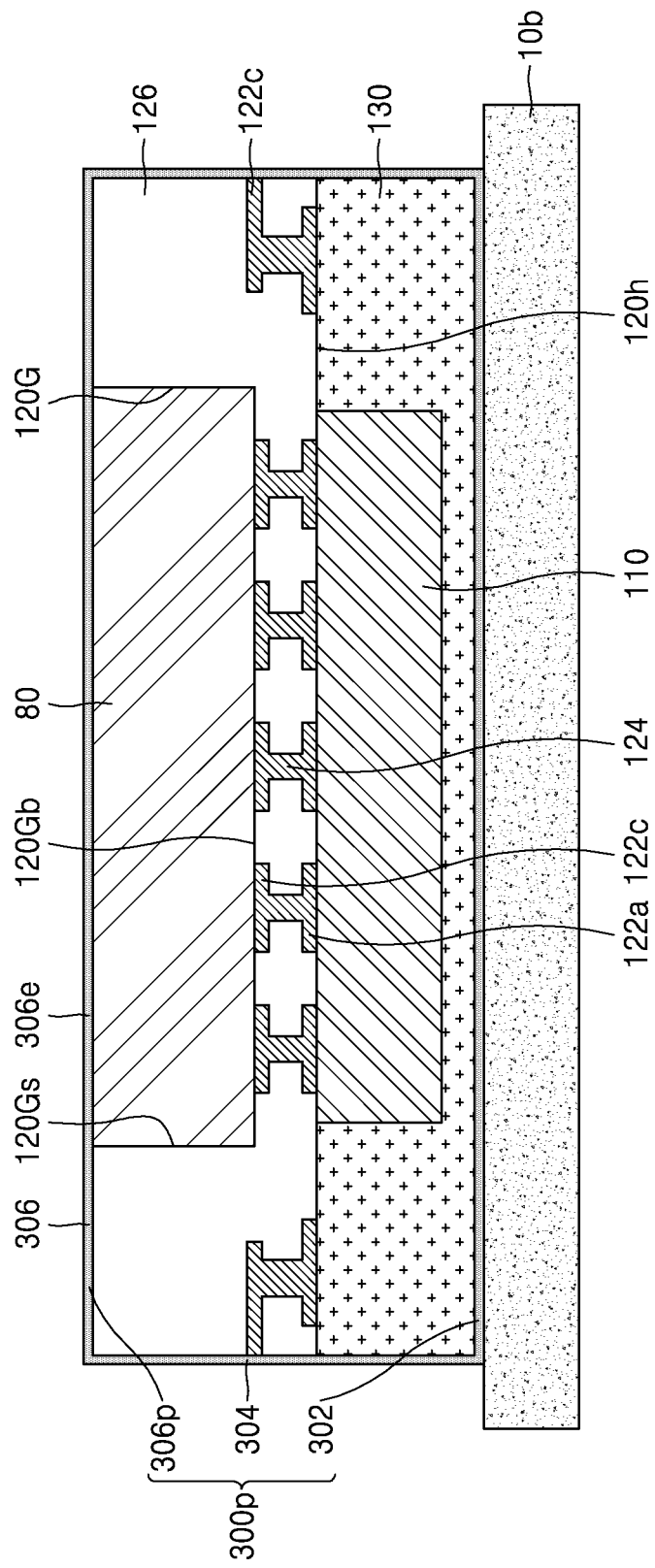

FIGS. 16 and 17 are cross-sectional views sequentially illustrating processes of manufacturing a semiconductor package, according to an exemplary embodiment.

Referring to FIGS. 16 and 17 together, after filling the groove space 120G with a buried sacrificial layer 80, the first sub-package 100c is disposed on the substrate plate 10b such that the groove space 120G and the bottom surface 120l of the first package base substrate 120 face upward. Then, a preliminary electromagnetic wave shielding member 300p may be formed by providing the electromagnetic wave shield source S3.

The preliminary electromagnetic wave shielding member 300p may include the top portion 302 formed or provided on the top surface 100h of the first sub-package 100, the side portion 304 formed or provided on the side surface 100s, and a preliminary bottom portion 306p covering the bottom surface 100l and the buried sacrificial layer 80.

Then, when a lift-off process is performed to remove the buried sacrificial layer 80, a portion 306e of the preliminary bottom portion 306p covering the buried sacrificial layer 80 is also removed, and thus the bottom portion 306 covering the bottom surface 100l of the first sub-package 100 may be formed.

Figure 18:
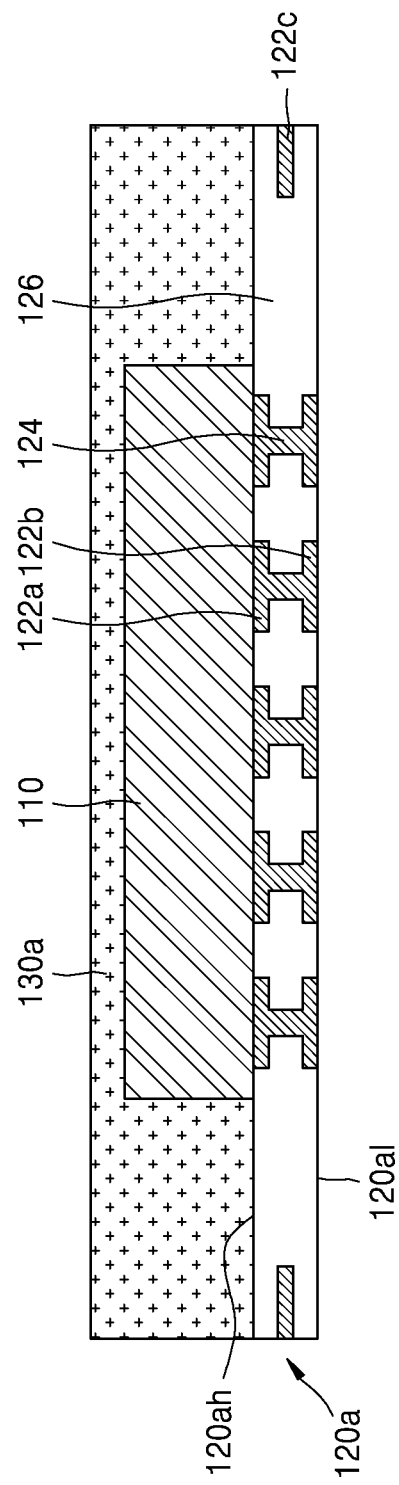
FIGS. 18 and 19 are cross-sectional views sequentially illustrating processes of manufacturing a semiconductor package, according to an exemplary embodiment.
Figure 19:
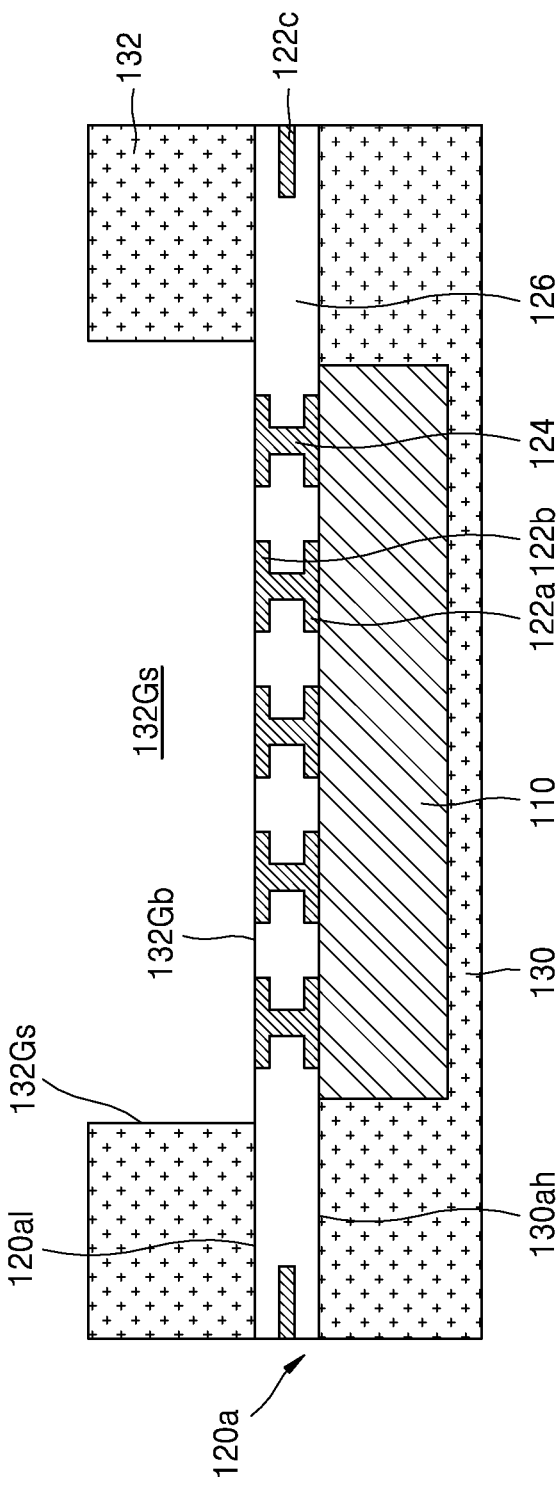

FIGS. 18 and 19 are cross-sectional views sequentially illustrating processes of manufacturing a semiconductor package, according to an exemplary embodiment.

Referring to FIG. 18, the first package base substrate 120a is prepared. The first package base substrate 120a may include the first chip connection pad 122a, the first package connection pad 122b, the electromagnetic wave shielding terminal 122c, and the first base layer 126a. A bottom surface 120al of the first package base substrate 120a may be flat.

Then, the first semiconductor chip 110 is mounted on the top surface 120ah of the first package base substrate 120a, and the first upper molding member 130a surrounding the first semiconductor chip 110 is formed. The first upper molding member 130a may cover, for example, the top surface 120ah of the first package base substrate 120a and the side and top surfaces of the first semiconductor chip 110. According to one or more exemplary embodiments, the first upper molding member 130a may be an exposed type mold that covers the side surface of the first semiconductor chip 110 and does not cover the top surface of the first semiconductor chip 110.

Referring to FIG. 19, the first lower molding member 132 is formed or provided on the bottom surface of the first package base substrate 120a. The first lower molding member 132 may cover, for example, a portion of the bottom surface 120al of the first package base substrate 120a. The groove space 132G may be a space defined by the bottom surface 120al of the first package base substrate 120a and the first lower molding member 132.

Then, the first sub-package 102 including the electromagnetic wave shielding member 300 of FIG. 6 may be formed or provided, and the semiconductor package 1c may be formed by disposing the second sub-package 200 in the groove space 132G, by using one of the methods described with reference to FIGS. 11 through 17.

In FIGS. 18 and 19, the first upper molding member 130a and the first lower molding member 132 are separately formed, but according to or more exemplary embodiments, the first upper molding member 130a and the first lower molding member 132 may be simultaneously formed.

While one or more exemplary embodiments have been particularly shown and described above, it will be understood that various changes in form and details may be made therein without departing from the spirit and scope of the inventive concept(s).

What is claimed is:
1. A semiconductor package comprising:
a first sub-package comprising:
  a first package base substrate on which a first semiconductor chip is mounted, and
  an electromagnetic wave shielding member having a top portion at a top surface of the first sub-package, side portions at side surfaces of the first sub-package, and bottom portions covering and directly contacting all of a bottom surface of the first sub-package, wherein a groove space extends inward from the bottom surface of the first sub-package; and
a second sub-package comprising a second package base substrate in the groove space and on which a second semiconductor chip is mounted,
wherein the second sub-package is connected to the first sub-package through an inter-package connection terminal attached to a first package connection pad on an innermost surface of the groove space of the first sub-package, and
wherein the second sub-package further comprises a molding member on the second package base substrate and surrounding the second semiconductor chip, the molding member being spaced apart from a lower surface and inner side surface of the groove space.

2. The semiconductor package of claim 1, wherein the bottom surface of the first sub-package and a bottom surface of the second sub-package are at a same height.

3. The semiconductor package of claim 1, further comprising an external connection terminal attached to a bottom surface of the second sub-package and protruding out from the groove space.

4. The semiconductor package of claim 1, wherein:
the groove space extends from a bottom surface of the first package base substrate into the first package base substrate; and
a depth of the groove space is less than a thickness of the first package base substrate.

5. The semiconductor package of claim 1, wherein the first sub-package further comprises:

an upper molding member on a top surface of the first package base substrate and surrounding the first semiconductor chip; and a lower molding member on a bottom surface of the first package base substrate and defining the groove space.

6. The semiconductor package of claim 5, wherein a portion of the bottom surface of the first package base substrate is exposed at the innermost surface of the groove space.

7. The semiconductor package of claim 1, wherein the electromagnetic wave shielding member further has inner side portions extending from the bottom portions of the electromagnetic wave shielding member and covering portions of inner side surfaces of the groove space.

8. The semiconductor package of claim 1, wherein side surfaces of the second sub-package are spaced apart from inner side surfaces of the groove space.

9. A semiconductor package comprising:
a first sub-package comprising:
a first package base substrate that is a unitary substrate,
a first semiconductor chip on the first package base substrate,
a first molding member on the first package base substrate and surrounding the first semiconductor chip, and
an electromagnetic wave shielding member covering a top surface of the first molding member, side surfaces of the first molding member, and side surfaces of the first package base substrate, wherein the first sub-package has a groove space extending inward from a bottom surface of the first package base substrate;
a second sub-package provided in the groove space and comprising:
a second package base substrate,
a second semiconductor chip on the second package base substrate, and
a second molding member on the second package base substrate and surrounding the second semiconductor chip, the second molding member being spaced apart from a lower surface and inner side surfaces of the groove space; and
an electromagnetic wave shielding terminal at the side surfaces of the first package base substrate and contacting the electromagnetic wave shielding member, the side surfaces of the first package base substrate being distinct from and perpendicular to the bottom surface of the first package base substrate, and a bottommost surface of the electromagnetic wave shielding terminal in contact with and within the first package base substrate,
wherein a bottom surface of the first sub-package and a bottom surface of the second sub-package are at a same height, and
wherein a topmost surface of the electromagnetic wave shielding terminal and a top surface of the first package base substrate are at a same height.

10. The semiconductor package of claim 9, further comprising an external connection terminal attached to at least one of the bottom surface of the second sub-package and the bottom surface of the first package base substrate.

11. The semiconductor package of claim 9, further comprising an external connection terminal attached to a bottom surface of the second package base substrate and protruding out from the groove space,
wherein the electromagnetic wave shielding member covers all of the bottom surface of the first package base substrate.

12. The semiconductor package of claim 9, wherein the first sub-package and the second sub-package are electrically connected to each other by an inter-package connection terminal attached to an innermost surface of the groove space.

13. The semiconductor package of claim 12, further comprising an under-fill layer disposed between the innermost surface of the groove space and the second sub-package and surrounding the inter-package connection terminal.

14. A semiconductor package comprising:
a first sub-package comprising:
a first package base substrate on which a first semiconductor chip is mounted, the first package base substrate being a unitary substrate,
an upper molding member on a top surface of the first package base substrate and surrounding the first semiconductor chip, and
an electromagnetic wave shielding member covering a top surface of the upper molding member, side surfaces of the upper molding member, and side surfaces of the first package base substrate;
a second sub-package comprising a second package base substrate on which a second semiconductor chip is mounted, and a molding member on the second package base substrate and surrounding the second semiconductor chip; and
an electromagnetic wave shielding terminal at the side surfaces of the first package base substrate and contacting the electromagnetic wave shielding member, the side surfaces of the first package base substrate being distinct from and perpendicular to a bottom surface of the first package base substrate, and a bottommost surface of the electromagnetic wave shielding terminal in contact with and within the first package base substrate,
wherein the first sub-package has a groove space extending inward from a bottom surface of the first sub-package,
wherein the molding member of the second sub-package is spaced apart from a lower surface and inner side surfaces of the groove space, and
wherein side surfaces of the second sub-package and the inner side surfaces of the groove space are spaced apart from each other in the groove space.

15. The semiconductor package of claim 14, wherein:
the bottom surface of the first sub-package and a bottom surface of the second sub-package are at a same height; and
the electromagnetic wave shielding member covers all of the bottom surface of the first package base substrate.

16. The semiconductor package of claim 14, wherein:
the first sub-package further comprises a lower molding member on the bottom surface of the first package base substrate and defining the groove space; and
the electromagnetic wave shielding member further covers side surfaces of the lower molding member and bottom surfaces of the lower molding member.

* * * * *